(12) United States Patent
Maeno

(10) Patent No.: US 7,149,942 B2
(45) Date of Patent: Dec. 12, 2006

(54) SEMICONDUCTOR INTEGRATED CIRCUIT WITH TEST CIRCUIT

(75) Inventor: Hideshi Maeno, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 443 days.

(21) Appl. No.: 10/725,028

(22) Filed: Dec. 2, 2003

(65) Prior Publication Data

US 2004/0117706 A1    Jun. 17, 2004

Related U.S. Application Data

(63) Continuation-in-part of application No. 10/611,172, filed on Jul. 2, 2003.

(30) Foreign Application Priority Data

Dec. 16, 2002  (JP)  ............................. 2002-364099
Oct. 14, 2003   (JP)  ............................. 2003-353924

(51) Int. Cl.
    *G01R 31/28*    (2006.01)
(52) U.S. Cl. ....................... 714/726; 714/25
(58) Field of Classification Search .............. None
    See application file for complete search history.

(56) References Cited

U.S. PATENT DOCUMENTS 5,631,911 A  *  5/1997  Whetsel, Jr. ................. 714/727
5,729,553 A  *  3/1998  Motohara ..................... 714/733
5,815,512 A      9/1998  Osawa et al.
5,960,008 A  *  9/1999  Osawa et al. ................ 714/726
6,611,934 B1 *  8/2003  Whetsel, Jr. ................ 714/727
6,813,738 B1 * 11/2004  Whetsel, Jr. ................ 714/727

* cited by examiner

*Primary Examiner*—Guy Lamarre
*Assistant Examiner*—John P. Trimmings
(74) *Attorney, Agent, or Firm*—Buchanan Ingersoll & Rooney PC

(57) ABSTRACT

A semiconductor integrated circuit has a scan path that includes, between the output of the first logic section and the input of the functional block, a parallel path and a serial shift path for serially transferring data, and that includes first selectors for connecting the output of the first logic section or the serial shift path to the input of the functional block, and flip-flops for storing the data. The semiconductor integrated circuit further includes second selectors connected into the serial shift path of the scan path, for connecting the output of the functional block or the serial shift path to the input of the second logic section. Test data is provided from the serial shift path of the scan path to the functional block via the second selectors, and data output from the functional block is output via the second selectors after switching the second selectors.

18 Claims, 22 Drawing Sheets

SEMICONDUCTOR INTEGRATED CIRCUIT WITH TEST CIRCUIT

CROSS-REFERENCE TO THE RELATED APPLICATION

This application is a continuation-in-part of the patent application Ser. No. 10/611,172, whose filing date is Jul. 2, 2003.

BACKGROUND OF THE INVENTION

1. Field of the Invention

The present invention relates to a semiconductor integrated circuit including a functional block such as a RAM (Random Access Memory), a logic section connected to the functional block, and a test circuit for testing them.

2. Description of Related Art

FIG. 21 is a circuit diagram showing a configuration of a conventional semiconductor integrated circuit including a scan test function disclosed in a Relevant Reference 1. As shown in FIG. 21, the semiconductor integrated circuit includes selectors 10, 11 and 12 controlled by a shift mode signal SM; flip-flops (FFs) 30, 31 and 32; selectors 50, 51 and 52 controlled by a test mode signal TEST; logic sections 80 and 81; and a RAM 91.

In FIG. 21, the selectors 10, 11 and 12 and flip-flops 30, 31 and 32 constitute a scan path. The scan path is a memory circuit including parallel paths across the outputs of the logic section 80 and the inputs of the RAM 91, and a serial shift path for serially transmitting data from an SI (scan-in) terminal to an SO (scan-out) terminal.

Next, the operation of the semiconductor integrated circuit as shown in FIG. 21 will be described.

In a normal operation mode, the selectors 10, 11 and 12 are switched to their "0" input terminals by placing a shift mode signal at SM=0, and the selectors 50, 51 and 52 are switched to their "0" input terminals by placing a test mode signal at TEST=0. Thus, the data output from the logic section 80 are selected by the selectors 10, 11 and 12 to be supplied to the input terminals DI0, DI1 and DI2 of the RAM 91 via the flip-flops 30, 31 and 32. Although not shown in this figure, the flip-flops 30, 31 and 32 are supplied with a clock signal. In addition, the data from the output terminals DO0, DO1 and DO2 of the RAM 91 are selected by the selectors 50, 51 and 52 to be delivered to the logic section 81. In this way, in the normal operation mode, the data write and read are carried out under the condition that the RAM 91 is interposed between the logic sections 80 and 81.

In the scan test mode of the logic sections 80 and 81, the selectors 50, 51 and 52 are switched to the "1" input terminals by placing the test mode signal at TEST=1. In this state, the selectors 50, 51 and 52 select and output the data fed to the "1" input terminals. Accordingly, the RAM 91 is bypassed under the condition that the scan path is interposed between the logic section 80 and logic section 81. In this state, the scan test of the logic sections 80 and 81 is carried out with controlling the shift mode signal SM.

In the scan test mode of the logic section 81, the selectors 10, 11 and 12 are switched to the "1" input terminals by placing the shift mode signal at SM=1 so that they select the data fed to the "1" input terminals. Accordingly, when the flip-flops 30, 31 and 32 are supplied with three clock pulses, 3-bit test data fed to the SI terminal are shifted serially and stored in the flip-flops 30, 31 and 32. Since the test mode signal TEST=1 in this case, the 3-bit test data stored in the flip-flops 30, 31 and 32 are supplied to the logic section 81. Thus, the scan test of the logic section 81 is carried out by checking the data the logic section 81 outputs.

In the scan test mode of the logic section 80, the selectors 10, 11 and 12 are switched to the "0" input terminals by placing the shift mode signal at SM=0 so that they select the 3-bit data output from the logic section 80, which has received test data and carried out specified operation. Receiving one clock pulse, the flip-flops 30, 31 and 32 store the 3-bit data fed from the logic section 80. The 1-bit data stored in the flip-flop 32 is output from the SO terminal. Subsequently, the selectors 10, 11 and 12 are switched to the "1" input terminals by placing the shift mode signal at SM=1. Then, supplying the flip-flops 30, 31 and 32 with two clock pulses causes the 1-bit data stored in the flip-flops 30 and 31 to be shifted and output serially from the SO terminal, thereby implementing the scan test of the logic section 80.

The semiconductor integrated circuit as shown in FIG. 21 can set the test data from the SI terminal to the input terminals DI0, DI1 and DI2 of the RAM 91 by the serial shift operation while the shift mode signal SM=1. However, it cannot load the data output from the output terminals DO0, DO1 and DO2 of the RAM 91 onto the flip-flops 30, 31 and 32 to output the data from the SO terminal. Consequently, it cannot carry out the test of the RAM 91 in isolation.

FIG. 22 is a circuit diagram showing a configuration of a conventional semiconductor integrated circuit with the test function of the RAM 91 in isolation, which is disclosed in the Relevant Reference 1. To carry out the test of the RAM 91, it includes, in addition to the semiconductor integrated circuit as shown in FIG. 21, selectors 60, 61 and 62 controlled by an output selecting signal SELDO, and selectors 70, 71 and 72 controlled by a RAM test signal RAMTEST.

The selectors 60, 61 and 62 have their "1" input terminals supplied with the data from the output terminals DO0, DO0 and DO2 of the RAM 91. The selector 60 has its "0" input terminal supplied with the test data from the SI terminal, and selectors 61 and 62 have their "0" input terminals supplied with the data from the flip-flops 30 and 31, respectively. On the other hand, the selectors 70, 71 and 72 have their "0" input terminals supplied with the data from the flip-flops 30, 31 and 32, and have their "1" input terminals with the RAM test data from the SID terminal.

Next, the operation of the semiconductor integrated circuit as shown in FIG. 22 will be described.

In the normal operation mode, the selectors 10, 11 and 12 are switched to their "0" input terminals by placing the shift mode signal at SM=0, the selectors 50, 51 and 52 are switched to their "0" input terminals by placing the test mode signal at TEST=0, and the selectors 70, 71 and 72 are switched to their "0" input terminals by placing the RAM test signal at RAMTEST=0. In this state, the data output from the logic section 80 are supplied to the input terminals DI0, DI1 and DI2 of the RAM 91 via the flip-flops 30, 31 and 32. The flip-flops 30, 31 and 32 are fed with the clock signal. The data from the output terminals DO0, DO1 and DO2 of the RAM 91 are transferred to the logic 81. Thus, in the normal operation mode, the data are written and read in the condition that the RAM 91 is interposed between the logic sections 80 and 81.

In the scan test mode of the logic sections 80 and 81, the selectors 50, 51 and 52 are switched to their "1" input terminals by placing the test mode signal at TEST=1, and the selectors 60, 61 and 62 are switched to their "0" input terminals by placing the output selecting signal at SELDO=0. Thus, the RAM 91 and the scan path are place in the condition that the RAM 91 is bypassed, and the scan path is interposed between the logic sections 80 and 81. In this state, the logic sections 80 and 81 are subjected to the scan test by controlling the shift mode signal SM in the same manner as the semiconductor integrated circuit as shown in FIG. 21.

To test the RAM 91, the selectors 70, 71 and 72 are switched to their "1" input terminals by placing the RAM test signal at RAMTEST=1 so that the RAM test data from the SID terminal is supplied to the RAM 91 as the write data. Here, the 1-bit RAM test data is supplied to the RAM 91 in common as the 3-bit write data. In other words, the write data such as "000" or "111" are simultaneously supplied to the RAM 91.

The selectors 60, 61 and 62 controlled by the output selecting signal SELDO are provided for the purpose of loading the test result data from the output terminals DO0–DO2 of the RAM 91 onto the scan path. When the selectors 60, 61 and 62 are switched to their "1" input terminals by placing the output selecting signal at SELDO=1, and the selectors 10, 11 and 12 are switched to their "1" input terminals by placing the shift mode signal at SM=1, a clock pulse applied to the flip-flops 30, 31 and 32 causes them to store the test result data from the out put terminals DO0–DO2 of the RAM 91. In this case, the 1-bit data stored in the flip-flop 32 is output from the SO terminal. Subsequently, the selectors 60, 61 and 62 are switched to their "0" input terminals by placing the output selecting signal SELDO=0, and two clock pulses are applied to the flip-flops 30, 31 and 32. Thus, the 1-bit data stored in the flip-flops 30 and 31 are read out of the SO terminal by the serial shift operation. Thus, a test device outside the chip or a self-test circuit inside the chip makes a fault decision.

Relevant Reference 1: U.S. Pat. No. 5,960,008 (particularly, from column 5, line 12 to column 7, line 59).

With the foregoing configuration, the conventional semiconductor integrated circuit as shown in FIG. 21 has a problem of being unable to carry out the test of the functional block such as the RAM 91 in isolation. In addition, the circuit as shown in FIG. 22 has a problem in that the scale of the test circuit of the functional block such as the RAM 91 inevitably increases.

SUMMARY OF THE INVENTION

The present invention is implemented to solve the foregoing problems. It is therefore an object of the present invention to provide a semiconductor integrated circuit capable of carrying out the test of the functional block such as the RAM 91 in isolation without increasing the scale of the test circuit.

According to one aspect of the present invention, there is provided a semiconductor integrated circuit including a functional block connected between a first logic section and a second logic section; and a scan path that includes, between an output of the first logic section and an input of the functional block, a parallel path and a serial shift path for serially transferring data, and that includes a plurality of first selectors for switching and connecting the output of the first logic section or the serial shift path to the input of the functional block, and a plurality of flip-flops for storing the data. The semiconductor integrated circuit further includes a plurality of second selectors connected into the serial shift path of the scan path, for switching and connecting the output of the functional block or the serial shift path to the input of the second logic section. Test data is provided from the serial shift path of the scan path to the functional block via the second selectors, and data output from the functional block is output via the second selectors after switching the second selectors.

Thus, it offers an advantage of being able to carry out the test of the functional block in isolation without increasing the scale of the test circuit.

DETAILED DESCRIPTION OF THE PREFERRED EMBODIMENTS

The invention will now be described with reference to the accompanying drawings.

Embodiment 1

Figure 1:
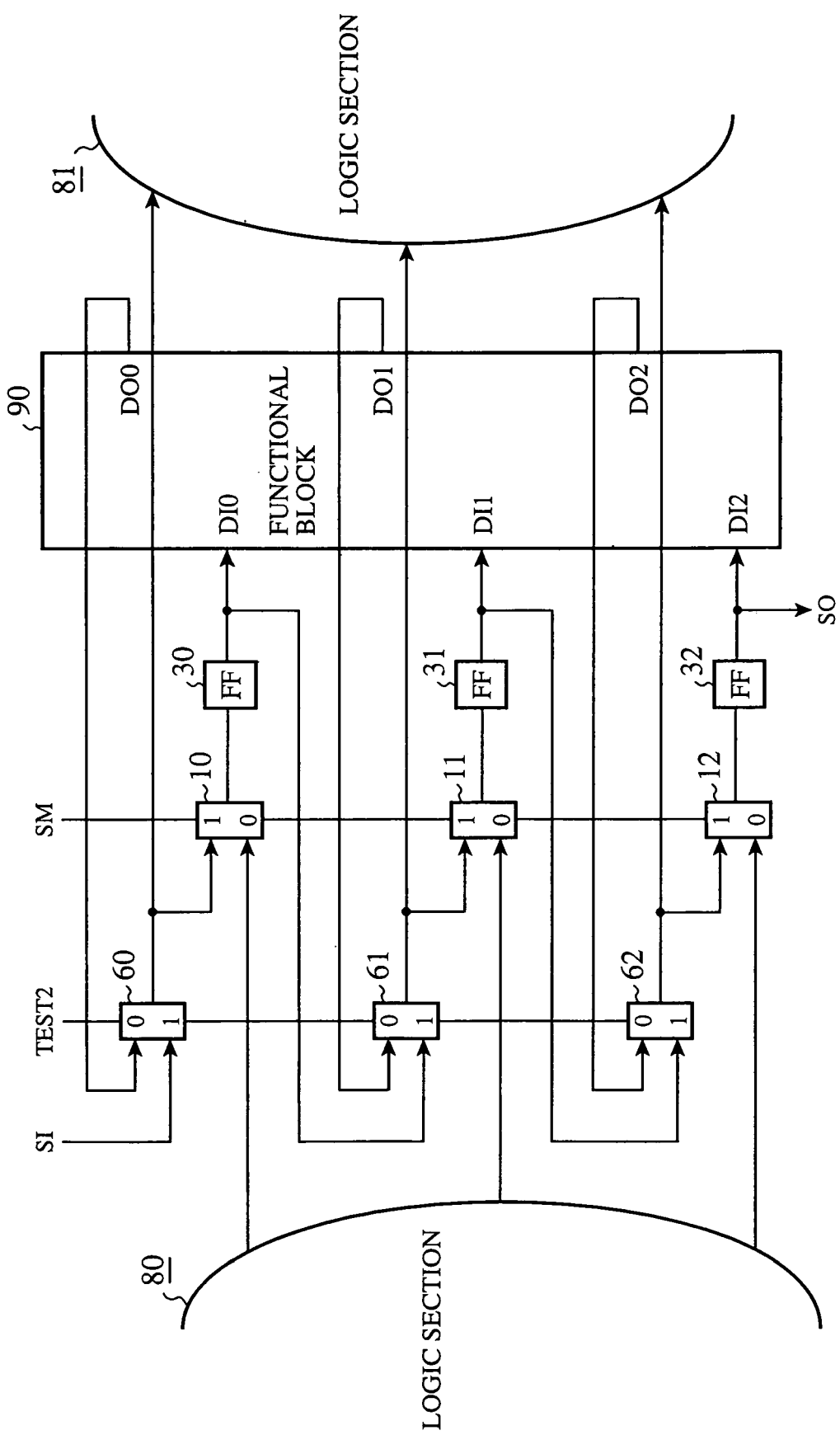
FIG. 1 is a circuit diagram showing a configuration of an embodiment 1 of the semiconductor integrated circuit in accordance with the present invention.

FIG. 1 is a circuit diagram showing a configuration of an embodiment 1 of the semiconductor integrated circuit in accordance with the present invention. As shown in FIG. 1, the semiconductor integrated circuit comprises selectors 10, 11 and 12 (first selectors) controlled by a shift mode signal SM; flip-flops (FFs) 30, 31 and 32; selectors 60, 61 and 62 (second selectors) controlled by a test mode signal TEST2; a logic section 80 (first logic section); a logic section 81 (second logic section); and a functional block 90. The functional block 90 can include, besides a RAM, various logical functional blocks such as a computing circuit, interface circuit, and memory block.

In FIG. 1, the selectors 60, 61 and 62, selectors 10, 11 and 12 and flip-flops 30, 31 and 32 constitute a scan path. The scan path is memory circuit including parallel paths across the outputs of the logic section 80 and the inputs of the functional block 90, and a serial shift path for serially transmitting data from an SI (scan-in) terminal to an SO (scan-out) terminal. The selectors 60, 61 and 62 are inserted into the serial shift path of the scan path.

Figure 21:
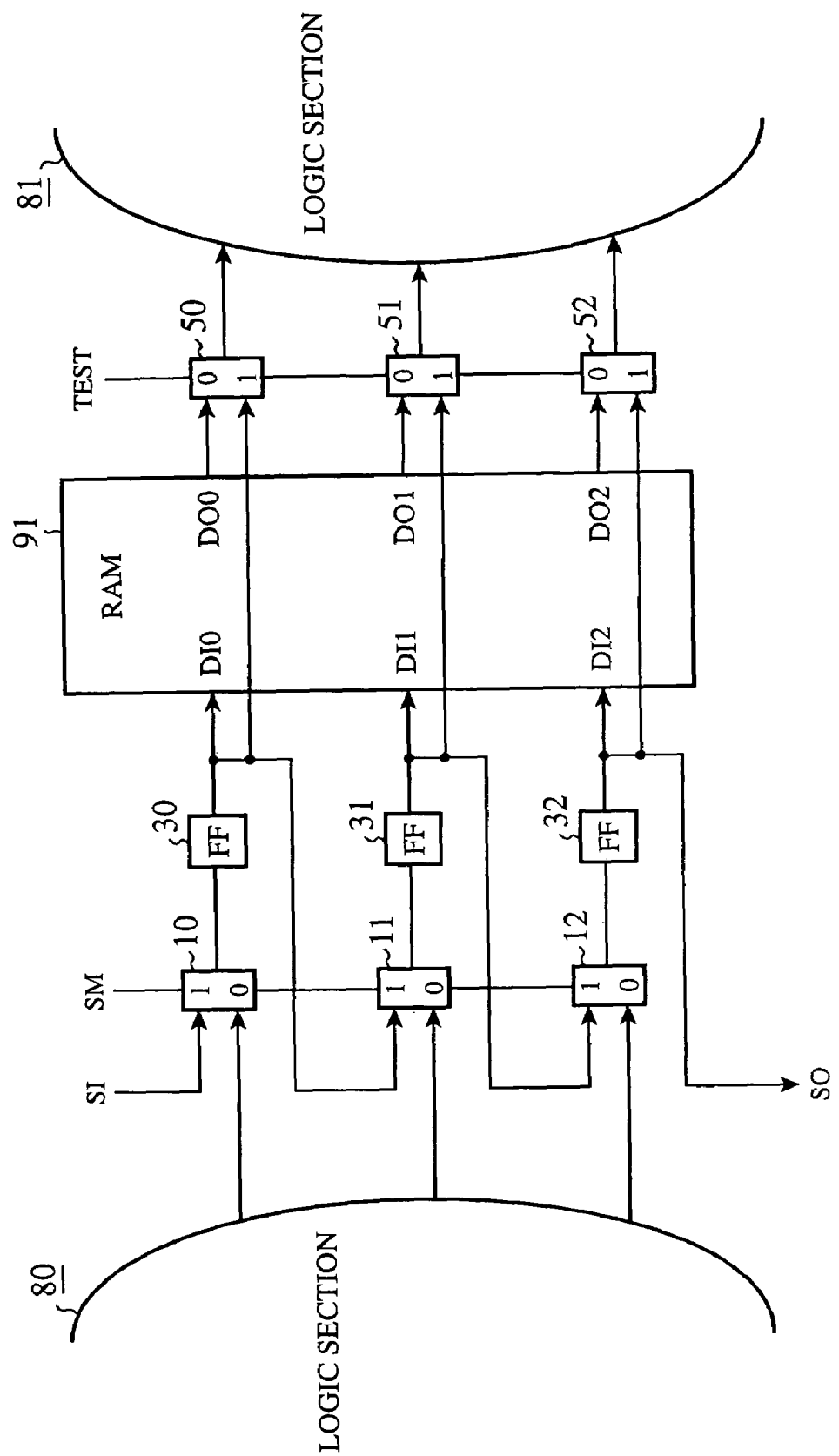
FIG. 21 is a circuit diagram showing a configuration of a conventional semiconductor integrated circuit.

In FIG. 1, the selectors 60, 61 and 62, which are interposed in positions different from those of the selectors 50, 51 and 52 of the conventional device of FIG. 21, supply the data output from the output terminals DO0, DO1 and DO2 of the functional block 90 to the scan path. This enables the test of the functional block 90 in isolation without increasing the scale of the test circuit.

Next, the operation of the present embodiment 1 will be described.

In the normal operation mode, the selectors 10, 11 and 12 are switched to their "0" input terminals by placing the shift mode signal at SM=0, and selectors 60, 61 and 62 are also switched to their "0" input terminals by placing the test mode signal at TEST2=0. In this state, the data output from the logic section 80 are selected by the selectors 10, 11 and 12 to be supplied to the input terminals DI0, DI1 and DI2 of the functional block 90 via the flip-flops 30, 31 and 32. Here, the flip-flops 30, 31 and 32 are supplied with the clock signal.

In addition, the data from the output terminals DO0, DO1 and DO2 of the functional block 90 are selected by the selectors 60, 61 and 62 to be delivered to the logic section 81. In this way, in the normal operation mode, specified computations and data processing are carried out under the condition that the functional block 90 is interposed between the logic sections 80 and 81.

In the scan test mode of the logic sections 80 and 81, the selectors 60, 61 and 62 are switched to their "1" input terminals by placing the test mode signal at TEST2=1. In this state, the functional block 90 is bypassed, and the scan path is interposed between the logic sections 80 and 81. The scan test of the logic sections 80 and 81 is carried out with controlling the shift mode signal SM.

In the scan test mode of the logic section 81, the selectors 10, 11 and 12 are switched to their "1" input terminals by placing the shift mode signal at SM=1. Accordingly, supplying two clock pulses to the flip-flops 30, 31 and 32 causes the 2-bit test data from the SI terminal to be shifted serially and stored into the flip-flops 30 and 31.

Since the test mode signal is placed at TEST2=1, the 1-bit test data next to the SI terminal is selected by the selector 60 and input to the logic section 81. Likewise, the individual 1-bit test data stored in the flip-flops 30 and 31 are selected by the selectors 61 and 62 and input to the logic section 81. Thus, the total of 3-bit test data carry out the scan test of the logic section 81.

In the scan test mode of the logic section 80, the selectors 10, 11 and 12 are switched to their "0" input terminals by placing the shift mode signal at SM=0. Receiving one clock pulse, the flip-flops 30, 31 and 32 store the 3-bit data output as the test result from the logic section 80 that has input the test data. In this case, the 1-bit data stored in the flip-flop 32 is output from the SO terminal.

Subsequently, the selectors 10, 11 and 12 are switched to their "1" input terminals by placing the shift mode signal at SM=1. Then, supplying the flip-flops 30, 31 and 32 with two clock pulses causes the individual 1-bit data stored in the flip-flops 30 and 31 to be shifted and output serially from the SO terminal, thereby enabling the confirmation of the contents of the total of 3-bit data. In this case, the next test data for the logic section 81 can be stored in the flip-flops 30 and 31 via the SI terminal. The scan test of the logic sections 80 and 81 is repeated a plurality of times with changing the input test data.

To carry out the test of the functional block 90, the selectors 10, 11 and 12 are switched to their "1" input terminals by placing the shift mode signal at SM=1. Then, the selectors 60, 61 and 62 are switched to their "1" input terminals by placing the test mode signal at TEST2=1. In this state, supplying three clock pulses to the flip-flops 30, 31 and 32 causes the 3-bit test data to be serially shifted from the SI terminal to the flip-flops 30, 31 and 32. Then, they are input to the input terminals DI0, DI1 and DI2 of the functional block 90. The functional block 90 carries out the specified operation, and the test result data are output from the output terminals DO0, DO1 and DO2.

Next, the selectors 60, 61 and 62 are switched to their "0" input terminals by placing the test mode signal at TEST2=0. Supplying one clock pulse to the flip-flops 30, 31 and 32 causes them to store the test result data output from the output terminals DO0, DO1 and DO2 of the functional block 90. In this case, the 1-bit data stored in the flip-flop 32 is output from the SO terminal.

Subsequently, the selectors 60, 61 and 62 are switched to their "1" input terminals by placing the test mode signal at TEST2=1. Supplying two clock pulses to the flip-flops 30, 31 and 32 causes the individual 1-bit data stored in them to be shifted out from the SO terminal, thereby making it possible to confirm the contents of the total of 3-bit data. The test of the functional block 90 is repeated a plurality of times with changing the test data input from the SI terminal.

As described above, the present embodiment 1 offers an advantage of being able to test the functional block 90 in isolation without increasing the scale of the test circuit.

Embodiment 2

Figure 2:
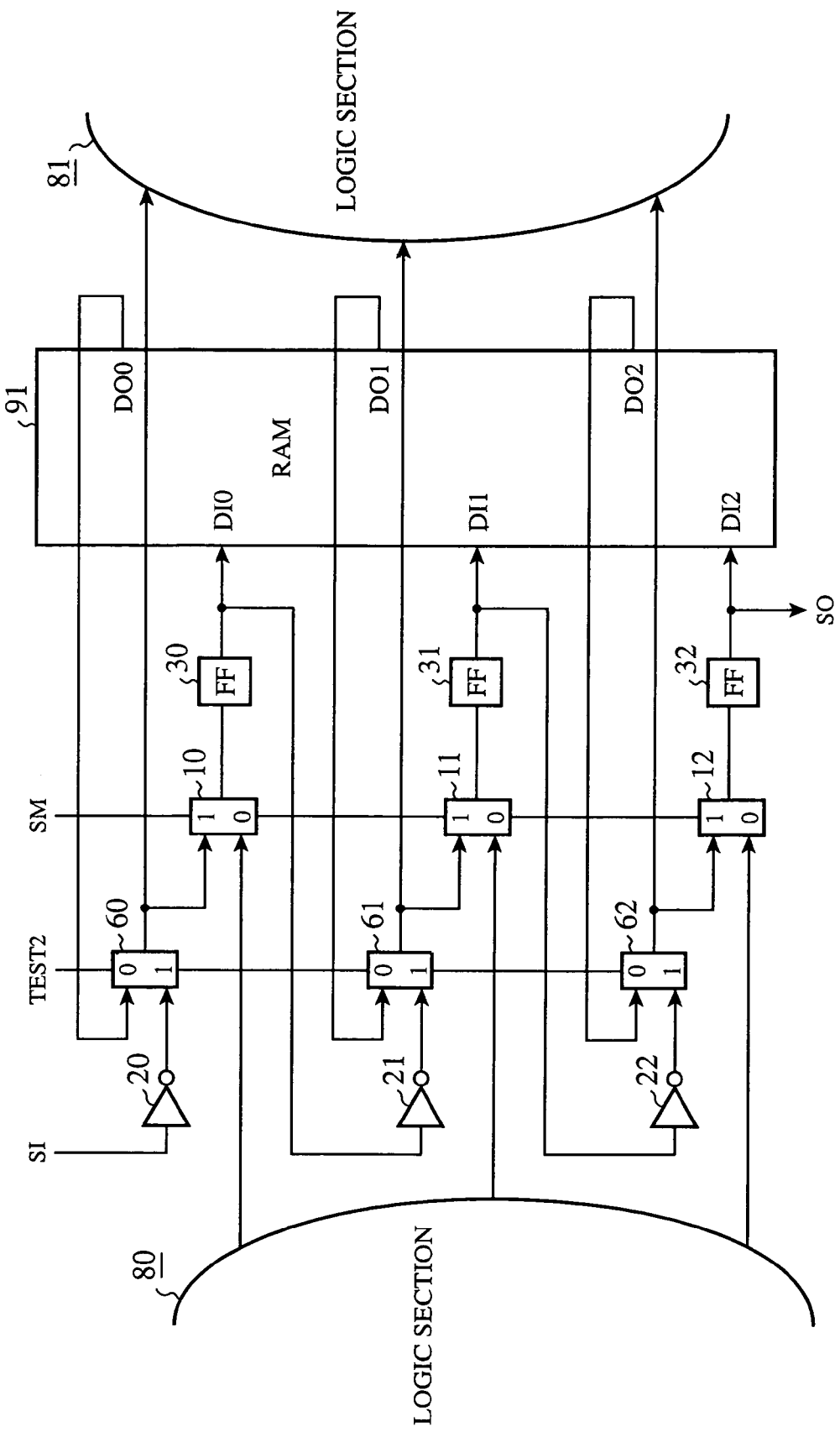
FIG. 2 is a circuit diagram showing a configuration of an embodiment 2 of the semiconductor integrated circuit in accordance with the present invention.

FIG. 2 is a circuit diagram showing a configuration of an embodiment 2 of the semiconductor integrated circuit in accordance with the present invention. As shown in FIG. 2, the present embodiment 2 replaces the functional block 90 of the foregoing embodiment 1 of FIG. 1 by a RAM 91, and interposes inverters 20, 21 and 22 into the serial shift path of the scan path. The inverters 20, 21 and 22 enable the test data to be written into the RAM 91 to be switched between all zero ("000") and all one ("111") at one clock cycle. Thus, the present embodiment 2 can easily carry out the test of the RAM 91 in such a manner that it writes "000" and then "111" in the next cycle, or writes "111" and then "000" in the next cycle.

Next, the operation of the present embodiment 2 will be described.

The normal operation is the same as that of the foregoing embodiment 1 except that the functional block 90 of the embodiment 1 is replaced by the RAM 91. In this case, the inverters 20, 21 and 22 are unrelated to the operation. The scan test of the logic sections 80 and 81 is basically the same as that of the embodiment 1 except that the test data and test result data are inverted or non-inverted through the inverters 20, 21 and 22.

First, the test of the RAM 91 will be described.

A write test of the initial data to the RAM 91 will be described first. The selectors 10, 11 and 12 are switched to their "1" input terminals by placing the shift mode signal at SM=1, and the selectors 60, 61 and 62 are switched to their "1" input terminals by placing the test mode signal at TEST2=1. Supplying three clock pulses to the flip-flops 30, 31 and 32 causes them to store the 3-bit test data fed from the SI terminal by the serial shift operation. It must be considered in this case that the flip-flops 30 and 32 store the test data inverted by the inverters 20, 21 and 22. For example, when the test data "010" is shifted in from the SI terminal, the flip-flops 30, 31 and 32 output the test data "111", which is supplied to the input terminals DI0, DI1 and DI2 of the RAM 91.

When successive test data "101010 . . . " are shifted in from the SI terminal, the input terminals DI0, DI1 and DI2 of the RAM 91 are supplied with the test data alternating between "111" and "000". When desired test data "111" or "000" are placed, the data is written to the RAM 91. Thus, the test data to be written into the RAM 91 can be switched between all zero ("000") and all one ("111") at one clock cycle. The test data write to the RAM 91 is repeated a plurality of times with changing the addresses.

Next, a read test from specified addresses of the RAM 91 will be described. The selectors 10, 11 and 12 are switched to their "1" input terminals by placing the shift mode signal at SM=1, whereas the selectors 60, 61 and 62 are switched to their "0" input terminals by placing the test mode signal at TEST2=0. The read test from specified addresses of the RAM 91 causes the test result data to be output from the output terminals DO0, DO1 and DO2 of the RAM 91, and then from the selectors 10, 11 and 12 via the selectors 60, 61 and 62. Supplying one clock pulse to the flip-flops 30, 31 and 32 causes them to store the test result data. In this case, the 1-bit data stored in the flip-flop 32 is output to the SO terminal.

Subsequently, the selectors 60, 61 and 62 are switched to their "1" input terminals by placing the test mode signal at TEST2=1. Supplying two clock pulses to the flip-flops 30, 31 and 32 causes the individual 1-bit data stored in the flip-flops 30 and 31 to be shifted out of the SO terminal by the serial shift operation, making it possible to confirm the contents of the total of 3-bit data. It must be considered in the test, however, that the data stored in the flip-flop 30 passes through the inverters 21 and 22, and the data stored in the flip-flop 31 passes through the inverter 22 before serially output from the SO terminal. The read test of the RAM 91 is repeated a plurality of times with changing the addresses.

The inverter 20 may be omitted when the test data to be shifted in from the SI terminal is inverted.

Figure 22:
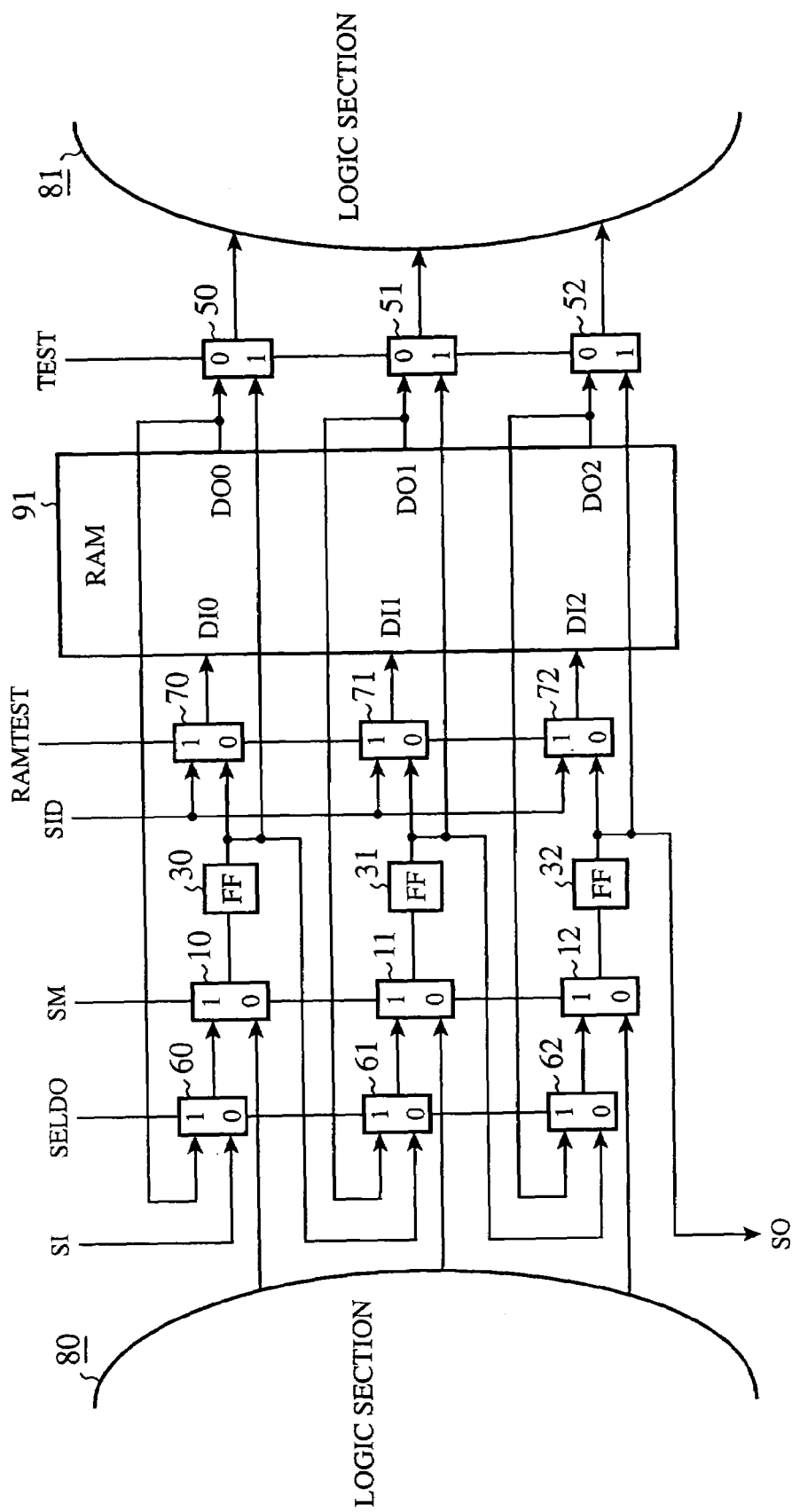
FIG. 22 is a circuit diagram showing another configuration of a conventional semiconductor integrated circuit.

Comparing the present embodiment 2 with the conventional device of FIG. 22, it is obvious that the present embodiment 2 can eliminate the selectors 50, 51 and 52 and selectors 70, 71 and 72 of FIG. 22.

As described above, the present embodiment 2 can test the RAM 91 in isolation without increasing the scale of the test circuit. In addition, it can switch the test data to be written into the RAM 91 between all zero ("000") and all one ("111") at one clock cycle. As a result, it offers an advantage of being able to test the RAM 91 efficiently.

Embodiment 3

Figure 3:
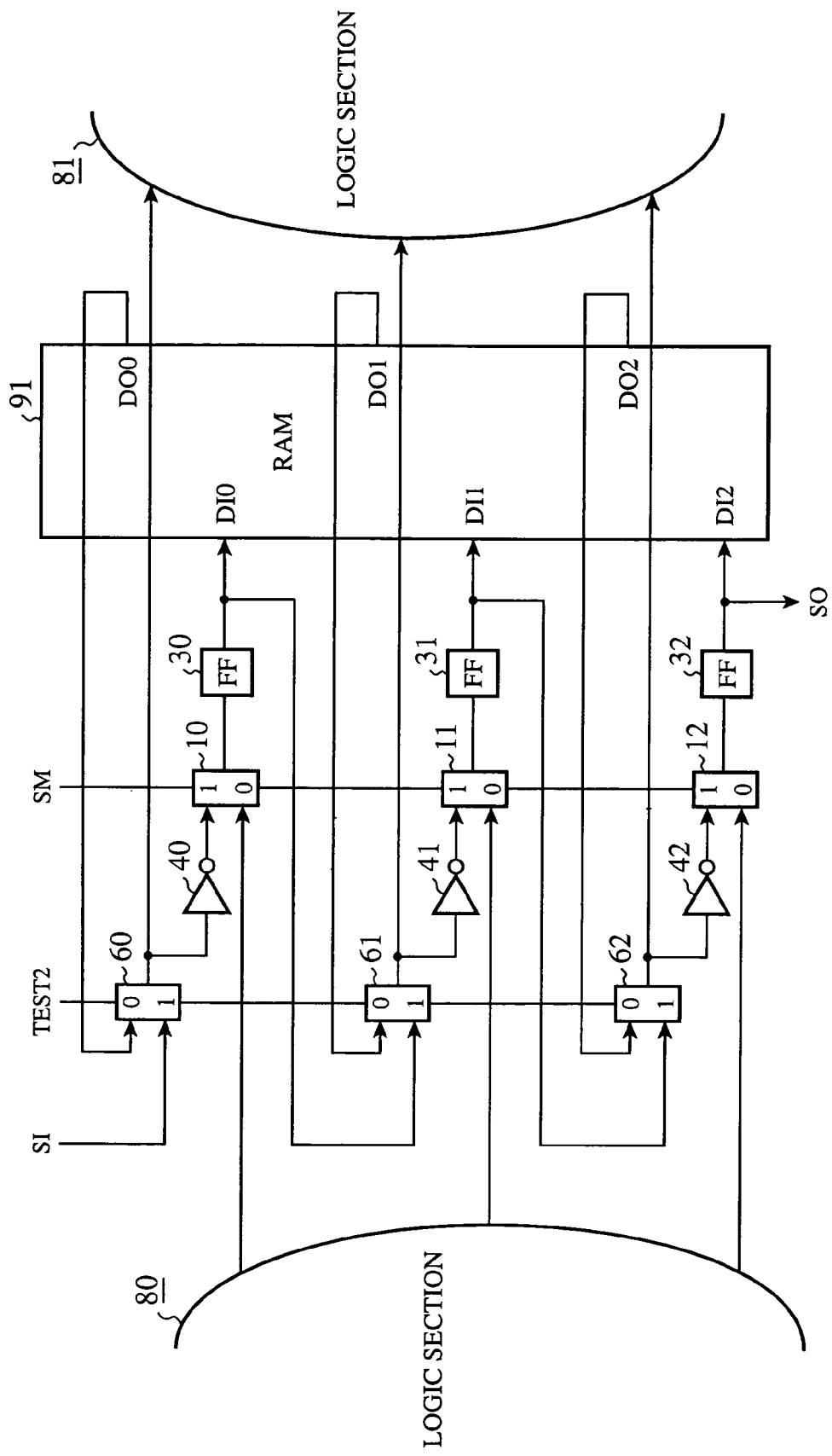
FIG. 3 is a circuit diagram showing a configuration of an embodiment 3 of the semiconductor integrated circuit in accordance with the present invention.

FIG. 3 is a circuit diagram showing a configuration of an embodiment 3 of the semiconductor integrated circuit in accordance with the present invention. As shown in FIG. 3, the present embodiment 3 has inverters 40, 41 and 42 interposed into the serial shift path of the scan path, instead of the inverters 20, 21 and 22 of the foregoing embodiment 2 of FIG. 2. Using the inverters 40, 41 and 42 makes it possible to switch the test data to be written into the RAM 91 between all zero ("000") and all one ("111") at one clock cycle.

Next, the operation of the present embodiment 3 will be described.

The normal operation is the same as that of the foregoing embodiment 1 except that the functional block 90 of the embodiment 1 is replaced by the RAM 91, with the inverters 40, 41 and 42 being unrelated to the operation. The scan test of the logic sections 80 and 81 is basically the same as that of the embodiment 1 except that the test data and test result data are inverted or non-inverted through the inverters 40, 41 and 42.

First, the test of the RAM 91 will be described.

A write test of the initial data to the RAM 91 will be described first. The selectors 10, 11 and 12 are switched to their "1" input terminals by placing the shift mode signal at SM=1, and the selectors 60, 61 and 62 are switched to their "1" input terminals by placing the test mode signal at TEST2=1. Supplying three clock pulses to the flip-flops 30, 31 and 32 causes them to store the 3-bit test data fed from the SI terminal by the serial shift operation. It must be considered in this case that the flip-flops 30 and 32 store the test data inverted by the inverters 40, 41 and 42. For example, when the test data "010" is shifted in from the SI terminal, the flip-flops 30, 31 and 32 output the test data "111", which are supplied to the input terminals DI0, DI1 and DI2 of the RAM 91.

When successive test data "101010 . . . " is shifted in from the SI terminal, the input terminals DI0, DI1 and DI2 of the RAM 91 are supplied with the test data alternating between "111" and "000". When desired test data "111" or "000" are placed, the data are written to the RAM 91. Thus, the test data to be written into the RAM 91 can be switched between all zero ("000") and all one ("111") at one clock cycle. The test data write to the RAM 91 is repeated a plurality of times with changing the addresses.

Next, a read and write test from and to specified addresses of the RAM 91 will be described. The selectors 10, 11 and 12 are switched to their "1" input terminals by placing the shift mode signal at SM=1, whereas the selectors 60, 61 and 62 are switched to their "0" input terminals by placing the test mode signal at TEST2=0. The read test from specified addresses of the RAM 91 causes the test result data to be output from the output terminals DO0, DO1 and DO2 of the RAM 91, and then from the selectors 10, 11 and 12 via the selectors 60, 61 and 62 and the inverters 40, 41 and 42 that invert the test result data. Supplying one clock pulse to the flip-flops 30, 31 and 32 causes them to store the test result data. In this case, the 1-bit data stored in the flip-flop 32 is output from the SO terminal.

Subsequently, the inverted test result data stored in the flip-flops 30, 31 and 32 is supplied to the input terminals DI0, DI1 and DI2 of the RAM 91 so that the inverted test result data is written into the RAM 91. For example, when the test result data output from the output terminals DO0, DO1 and DO2 of the RAM 91 is "000", the inverted test data "111" is written into the RAM 91 in the next cycle.

Subsequently, the selectors 60, 61 and 62 are switched to their "1" input terminals by placing the test mode signal at TEST2=1. Supplying two clock pulses to the flip-flops 30, 31 and 32 causes the individual 1-bit data stored in the flip-flops 30 and 31 to be shifted out of the SO terminal, making it possible to confirm the contents of the total of 3-bit data. It must be considered in the test, however, that the data stored in the flip-flop 30 passes through the inverters 41 and 42, and the data stored in the flip-flop 31 passes through the inverter 42 before serially output from the SO terminal. The read and write test of the RAM 91 is repeated a plurality of times with changing the addresses.

As described above, the present embodiment 3 can test the RAM 91 in isolation without increasing the scale of the test circuit. In addition, it can switch the test data to be written into the RAM 91 between all zero ("000") and all one ("111") at one clock cycle. As a result, it offers an advantage of being able to test the RAM 91 efficiently.

Embodiments 4

Figure 4:
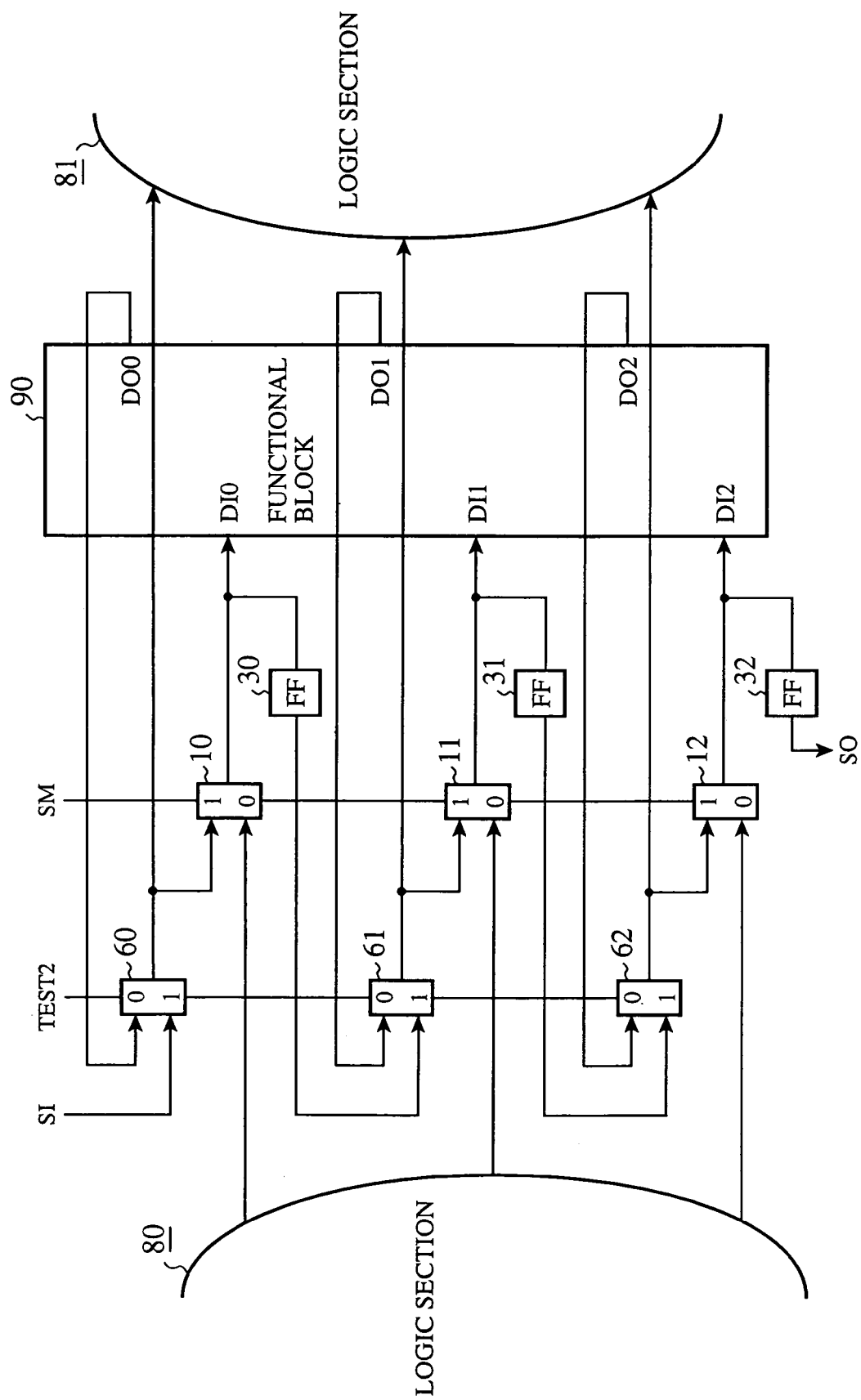
FIG. 4 is a circuit diagram showing a configuration of an embodiment 4 of the semiconductor integrated circuit in accordance with the present invention.

FIG. 4 is a circuit diagram showing a configuration of an embodiment 4 of the semiconductor integrated circuit in accordance with the present invention. Although the input terminals DI0, DI1 and DI2 of the functional block 90 are supplied with the outputs of the flip-flops 30, 31 and 32 in the foregoing embodiment 1 of FIG. 1, they are supplied with the outputs of the selectors 10, 11 and 12 in the present embodiment 4 as shown in FIG. 4.

Next, the operation of the present embodiment 4 will be described.

In the normal operation mode, the selectors 10, 11 and 12 are switched to their "0" input terminals by placing the shift mode signal at SM=0, and the selectors 60, 61 and 62 are switched to their "0" input terminals by placing the test mode signal at TEST2=0. The data output from the logic section 80 are selected by the selectors 10, 11 and 12 to be directly supplied to the input terminals DI0, DI1 and DI2 of the functional block 90.

In addition, the data from the output terminals DO0, DO1 and DO2 of the functional block 90 are selected by the selectors 60, 61 and 62 to be delivered to the logic section 81. In this way, in the normal operation mode, specified computations and data processing are carried out under the condition that the functional block 90 is interposed between the logic sections 80 and 81. In the present embodiment 4, the flip-flops 30, 31 and 32 have nothing to do with the normal operation mode. Thus, it is not necessary in the normal operation mode to supply the flip-flops 30, 31 and 32 with the clock signal.

As for the scan test of the logic sections 80 and 81, it is the same as that of the foregoing embodiment 1 of FIG. 1. This is because the positions of the flip-flops 30, 31 and 32 in the serial shift path of the scan path are the same in both the embodiment 1 and 4.

To carry out the test of the functional block 90, the selectors 10, 11 and 12 are switched to their "1" input terminals by placing the shift mode signal at SM=1. Then, the selectors 60, 61 and 62 are switched to their "1" input terminals by placing the test mode signal at TEST2=1. In this state, supplying two clock pulses to the flip-flops 30, 31 and 32 causes the 2-bit test data to be serially shifted from the SI terminal to the flip-flops 30 and 31.

The next 1-bit test data input to the SI terminal is selected by the selectors 60 and 10, and supplied to the input terminal DI0 of the functional block 90. On the other hand, the individual 1-bit test data stored in the flip-flops 30 and 31 are selected by the selectors 61 and 62 and selectors 11 and 12, and supplied to the input terminals DI1 and DI2 of the functional block 90. The functional block 90 carries out the prescribed operation, and the test result data are output from the output terminals DO0, DO1 and DO2 of the functional block 90.

Next, the selectors 60, 61 and 62 are switched to their "0" input terminals by placing the test mode signal at TEST2=0. Supplying one clock pulse to the flip-flops 30, 31 and 32 causes them to store the test result data output from the output terminals DO0, DO1 and DO2 of the functional block 90. In this case, the 1-bit data stored in the flip-flop 32 is output from the SO terminal.

Subsequently, the selectors 60, 61 and 62 are switched to their "1" input terminals by placing the test mode signal at TEST2=1. Supplying two clock pulses to the flip-flops 30, 31 and 32 causes the individual 1-bit data stored in them to be shifted out of the SO terminal, thereby making it possible to confirm the contents of the total of 3-bit data. The test of the functional block 90 is repeated a plurality of times with changing the test data input from the SI terminal.

As described above, the present embodiment 4 offers an advantage of being able to test the functional block 90 in isolation without increasing the scale of the test circuit. In addition, it offers an advantage of being able to carry out the normal operation mode without supplying the flip-flops 30, 31 and 32 with the clock signal.

Embodiment 5

Figure 5:
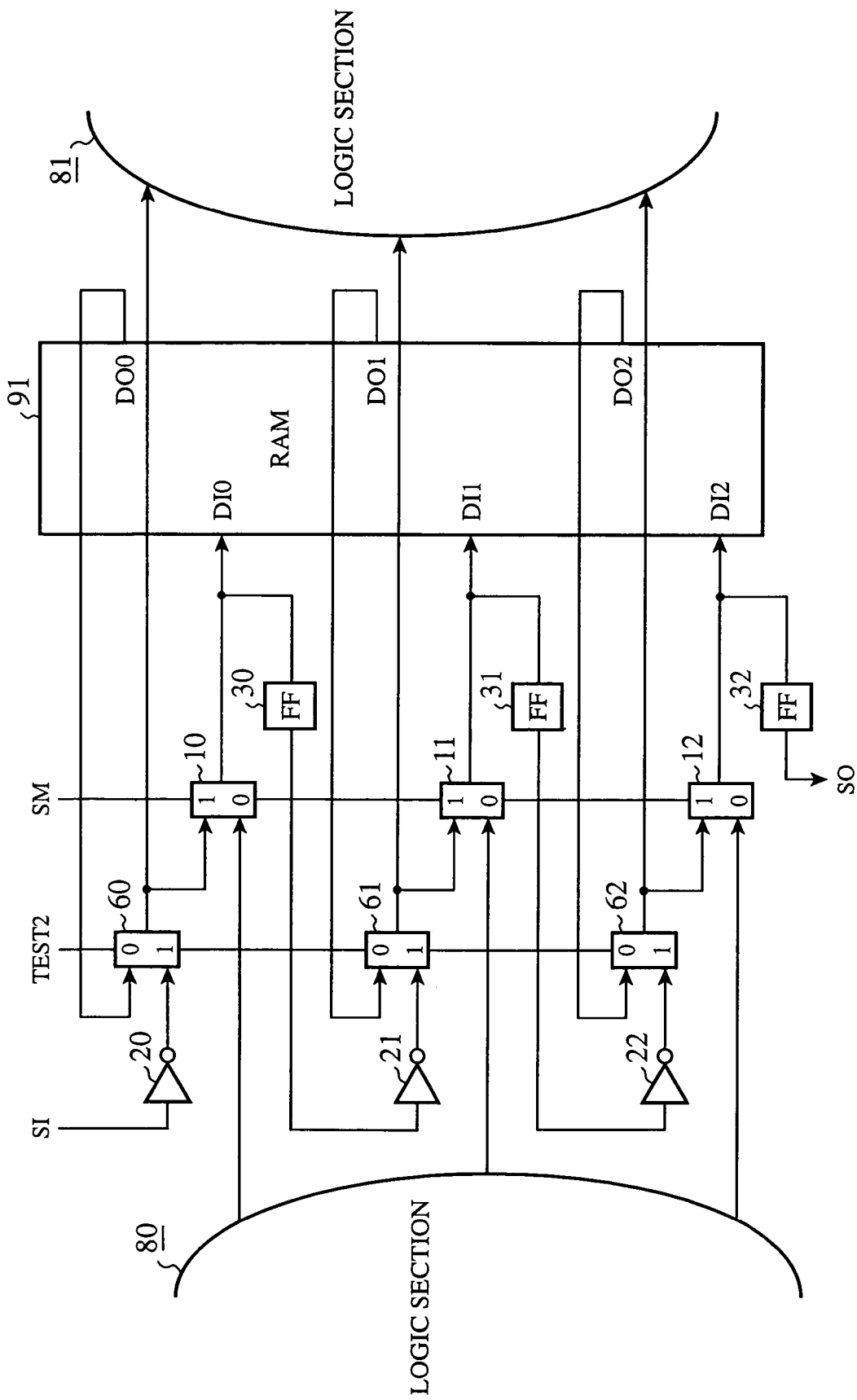
FIG. 5 is a circuit diagram showing a configuration of an embodiment 5 of the semiconductor integrated circuit in accordance with the present invention.

FIG. 5 is a circuit diagram showing a configuration of an embodiment 5 of the semiconductor integrated circuit in accordance with the present invention. Although the input terminals DI0, DI1 and DI2 of the RAM 91 are supplied with the output of the flip-flops 30, 31 and 32 in the foregoing embodiment 2 of FIG. 2, they are supplied with the output of the selectors 10, 11 and 12 in the present embodiment 5 as shown in FIG. 5.

Next, the operation of the present embodiment 5 will be described.

The normal operation is the same as that of the foregoing embodiment 4 except that the functional block 90 of the embodiment 4 is replaced by the RAM 91, with the inverters 20, 21 and 22 and flip-flops 30, 31 and 32 having nothing to do with the normal operation. Thus, it is unnecessary for the flip-flops 30, 31 and 32 to be supplied with the clock signal. The scan test of the logic sections 80 and 81 is basically the same as that of the embodiment 4 except that the test data and test result data are inverted or non-inverted through the inverters 20, 21 and 22.

The test of the RAM 91 will be described.

First, a write test of the initial data to the RAM 91 will be described. The selectors 10, 11 and 12 are switched to their "1" input terminals by placing the shift mode signal at SM=1, and the selectors 60, 61 and 62 are switched to their "1" input terminals by placing the test mode signal at TEST2=1. Supplying two clock pulses to the flip-flops 30, 31 and 32 causes the flip-flops 30 and 31 to store the 2-bit test data fed from the SI terminal by the serial shift operation.

In this case, the flip-flop 30 stores the inverted test data. Accordingly, when the data "10" is shifted in from the SI terminal, the outputs of the flip-flops 30 and 31 become "11". The output of the flip-flop 30 is supplied to the input terminal DI1 of the RAM 91 via the inverter 21, and the output of the flip-flop 31 is supplied to the input terminal DI2 of the RAM 91 via the inverter 22. Thus, the input terminals DI1 and DI2 of the RAM 91 are supplied with the test data "00". When the successive test data "1" is supplied from the SI terminal to the input terminal DI0 of the RAM 91 via the inverter 20, the test data supplied to the input terminals DI0, DI1 and DI2 of the RAM 91 become "000".

When successive test data "101010 . . .", in which the first bit "1" is the foregoing test data, is shifted in from the SI terminal, the input terminals DI0, DI1 and DI2 of the RAM 91 are supplied with the test data alternating between "111" and "000". When desired test data "111" or "000" are placed, the data are written to the RAM 91. Thus, the test data to be written into the RAM 91 can be switched between all zero ("000") and all one ("111") at one clock cycle. The test data write to the RAM 91 is repeated a plurality of times with changing the addresses.

As for the read test from specified addresses of the RAM 91, it is the same as that of the foregoing embodiment 2. The inverter 20 can be omitted as in the embodiment 2.

As described above, the present embodiment 5 can test the RAM 91 in isolation without increasing the scale of the test circuit. In addition, it can switch the test data to be written into the RAM 91 between all zero ("000") and all one ("111") at one clock cycle. As a result, it offers an advantage of being able to test the RAM 91 efficiently. Furthermore, it offers an advantage of being able to carry out the normal operation mode without supplying the flip-flops 30, 31 and 32 with the clock signal.

Embodiment 6

Figure 6:
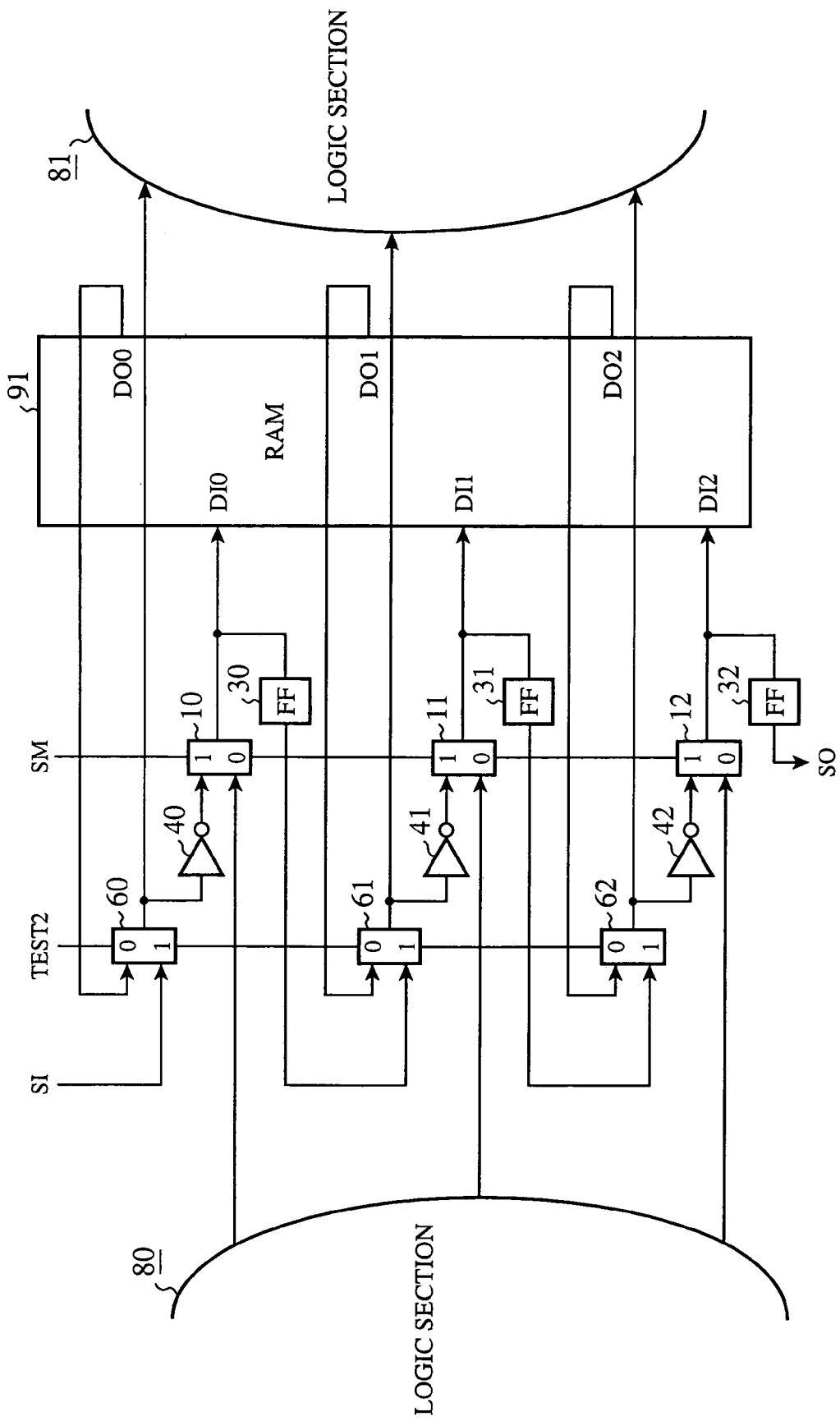
FIG. 6 is a circuit diagram showing a configuration of an embodiment 6 of the semiconductor integrated circuit in accordance with the present invention.

FIG. 6 is a circuit diagram showing a configuration of an embodiment 6 of the semiconductor integrated circuit in accordance with the present invention. Although the input terminals DI0, DI1 and DI2 of the RAM 91 are supplied with the outputs of the flip-flops 30, 31 and 32 in the foregoing embodiment 3 of FIG. 3, they are supplied with the outputs of the selectors 10, 11 and 12 in the present embodiment 6 as shown in FIG. 6.

Next, the operation of the present embodiment 6 will be described.

The normal operation is the same as that of the foregoing embodiment 4 except that the functional block 90 of the embodiment 4 is replaced by the RAM 91, and the inverters 40, 41 and 42 and flip-flops 30, 31 and 32 have nothing to do with the normal operation. Thus, it is unnecessary for the flip-flops 30, 31 and 32 to be supplied with the clock signal. The scan test of the logic sections 80 and 81 is basically the same as that of the embodiment 4 except that the test data and test result data are inverted or non-inverted through the inverters 40, 41 and 42.

The test of the RAM 91 will be described. A write test of the initial data to the RAM 91 is the same as that of the foregoing embodiment 5 except that the inverters 20, 21 and 22 are replaced with the inverters 40, 41 and 42.

Next, a read and write test from and to specified addresses of the RAM 91 will be described. The selectors 10, 11 and 12 are switched to their "1" input terminals by placing the shift mode signal at SM=1, whereas the selectors 60, 61 and 62 are switched to their "0" input terminals by placing the test mode signal at TEST2=0. The read test from specified addresses of the RAM 91 causes the test result data to be output from the output terminals DO0, DO1 and DO2 of the RAM 91, and then from the selectors 10, 11 and 12 via the selectors 60, 61 and 62 and the inverters 40, 41 and 42 that invert the test result data.

Subsequently, the inverted test result data output from the selectors 10, 11 and 12 are supplied to the input terminals DI0, DI1 and DI2 of the RAM 91 so that the inverted test result data are written into the RAM 91. For example, when the test result data output from the output terminals DO0, DO1 and DO2 of the RAM 91 are "000", the inverted data "111" are written into the RAM 91 in the next cycle.

Supplying one clock pulse to the flip-flops 30, 31 and 32 causes them to store the inverted test result data output from the selectors 10, 11 and 12. In this case, the 1-bit data stored in the flip-flop 32 is output from the SO terminal.

Subsequently, the selectors 60, 61 and 62 are switched to their "1" input terminals by placing the test mode signal at TEST2=1. Supplying two clock pulses to the flip-flops 30, 31 and 32 causes the individual 1-bit data stored in the flip-flops 30 and 31 to be shifted out from the SO terminal, making it possible to confirm the contents of the total of 3-bit data. It must be considered in the test, however, that the data stored in the flip-flop 30 passes through the inverters 41 and 42, and the data stored in the flip-flop 31 passes through the inverter 42 before serially output from the SO terminal. The read and write test of the RAM 91 is repeated a plurality of times with changing the addresses.

As described above, the present embodiment 6 can test the RAM 91 in isolation without increasing the scale of the test circuit. In addition, it can switch the test data to be written into the RAM 91 between all zero ("000") and all one ("111") at one clock cycle. As a result, it offers an advantage of being able to test the RAM 91 efficiently. Furthermore, it offers an advantage of being able to carry out the normal operation mode without supplying the flip-flops 30, 31 and 32 with the clock signal.

Embodiment 7

Figure 7:
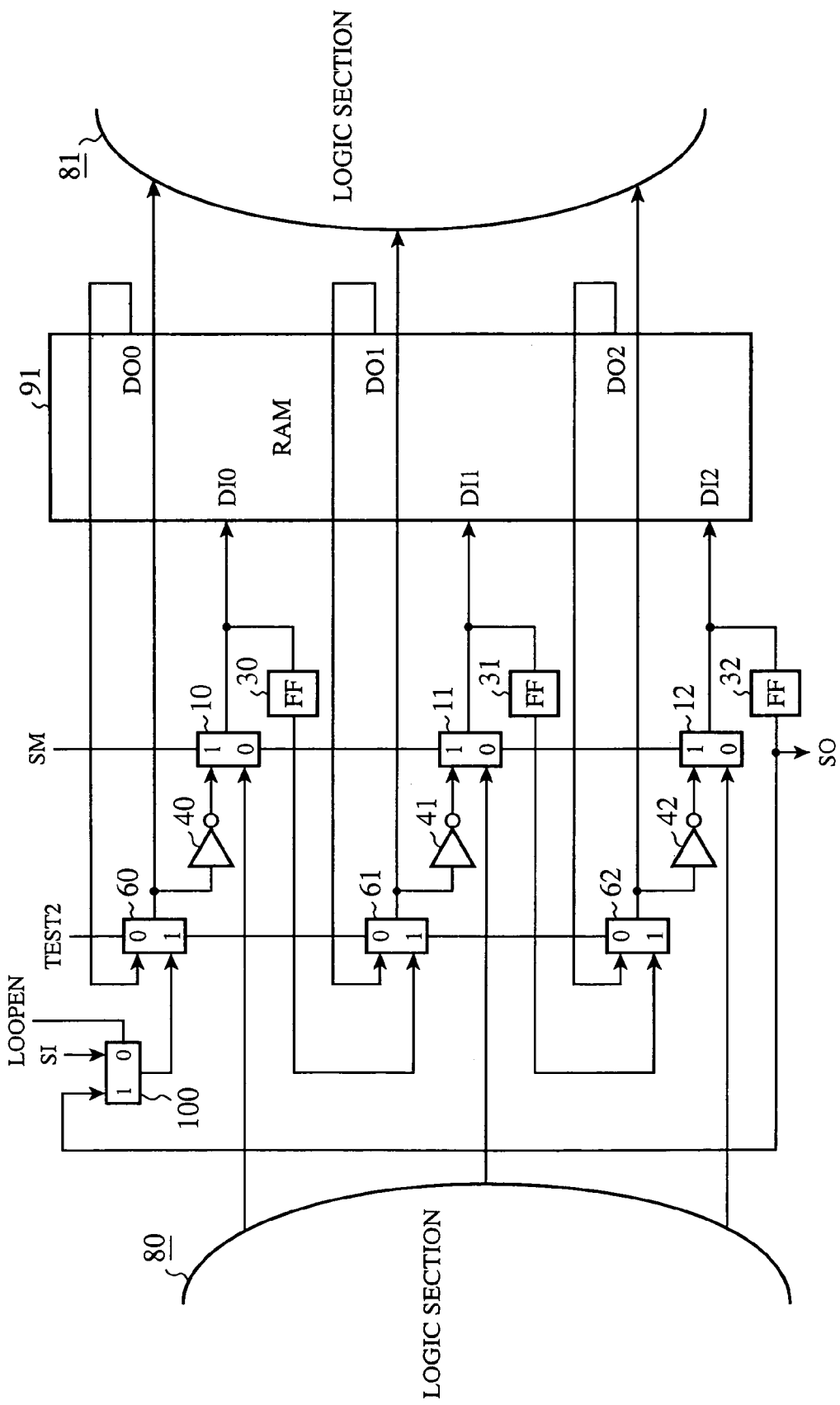
FIG. 7 is a circuit diagram showing a configuration of an embodiment 7 of the semiconductor integrated circuit in accordance with the present invention.

FIG. 7 is a circuit diagram showing a configuration of an embodiment 7 of the semiconductor integrated circuit in accordance with the present invention. As shown in FIG. 7, the present embodiment 7 has a selector 100 (third selector) for feeding the data supplied to the SO terminal back to the SI terminal in addition to the foregoing embodiment 6 of FIG. 6. The selector 100 is controlled by a loop enabling signal LOOPEN. The selector 100 can also be added to the embodiment 2 of FIG. 2, embodiment 3 of FIG. 3, and embodiment 5 of FIG. 5.

Next, the operation of the present embodiment 7 will be described.

In the normal operation mode, the selectors 10, 11 and 12 are switched to their "0" input terminals by placing the shift mode signal at SM=0, and the selectors 60, 61 and 62 are switched to their "0" input terminals by placing the test mode signal at TEST2=0. The inverters 40, 41 and 42 and flip-flops 30, 31 and 32 are unrelated to the normal operation mode, so that the normal operation is carried out as in the foregoing embodiment 4 except that the functional block 90 of the embodiment 4 is changed to the RAM 91. Thus, the flip-flops 30, 31 and 32 need not be supplied with the clock signal.

To carry out the scan test of the logic sections 80 and 81, the selector 100 is switched to its "0" input terminal by placing the loop enabling signal at LOOPEN=0, and the selectors 60, 61 and 62 are switched to their "1" input terminals by placing the test mode signal at TEST2=1. The scan test of the logic sections 80 and 81 is basically the same as that of the embodiment 4, in which it should be considered that the test data and test result data are inverted or non-inverted through the inverters 40, 41 and 42.

Next, the test of the RAM 91 will be described.

First, a write test of the initial data to the RAM 91 will be described. The selector 100 is switched to its "0" input terminal by placing the loop enabling signal at LOOPEN=0, the selectors 10, 11 and 12 are switched to their "1" input terminals by placing the shift mode signal at SM=1, and the selectors 60, 61 and 62 are switched to their "1" input terminals by placing the test mode signal at TEST2=1.

Supplying three clock pulses to the flip-flops 30, 31 and 32 causes them to store the 3-bit test data fed from the SI terminal by the serial shift operation. It must be considered in this case that the flip-flops 30 and 32 store the inverted test data. For example, when the test data "010" are shifted in from the SI terminal, the flip-flops 30, 31 and 32 output the test data "111", which are supplied to the input terminals DI0, DI1 and DI2 of the RAM 91. In this state, the test data next to the SI terminal is inverted by the inverter 40 and supplied to the input terminal DI0 of the RAM 91, the output data "1" of the flip-flop 30 is inverted by the inverter 41 and supplied to the input terminal DI1 of the RAM 91, and the output data "1" of the flip-flop 31 is inverted by the inverter 42 and supplied to the input terminal DI2 of the RAM 91.

Subsequently, the selector 100 is switched to its "1" input terminal by placing the loop enabling signal at LOOPEN=1. Then, the output data "1" of the flip-flop 32 is transferred to the input terminal DI0 of the RAM 91 via the inverter 40, thereby placing the data at the input terminals DI0, DI1 and DI2 of the RAM 91 at "000". Every time the clock pulse is supplied to the flip-flops 30, 31 and 32 in the state the loop enabling signal is set at LOOPEN=1, the data at the input terminals DI0, DI1 and DI2 of the RAM 91 are changed through the inverters 40, 41 and 42, alternating the data between "000" and "111". When the intended test data "000" or "111" are set, the write operation of the RAM 91 is carried out. The test data write to the RAM 91 is repeated a plurality of times with varying the addresses.

The read and write test of the specified addresses of the RAM 91 is carried out as in the embodiment 6, in which case the loop enabling signal LOOPEN can be set at either "1" or "0".

Although the write test of the initial data to the RAM 91 is performed by shifting the test data in from the SI terminal such that the outputs of the flip-flops 30, 31 and 32 become "111" in the present embodiment 7, this is not essential. It is also possible to shift the test data in from the SI terminal such that the outputs of the flip-flops 30, 31 and 32 become "000".

As described above, the present embodiment 7 can test the RAM 91 in isolation without increasing the scale of the test circuit. In addition, it can switch the test data to be written into the RAM 91 between all zero ("000") and all one ("111") at one clock cycle. As a result, it offers an advantage of being able to test the RAM 91 efficiently. Furthermore, it offers an advantage of being able to carry out the normal operation mode without supplying the flip-flops 30, 31 and 32 with the clock signal.

Moreover, the present embodiment 7 is configured such that the data supplied to the input terminals DI0–DI2 of the RAM 91 alternate between "111" and "000" every time the clock pulse is supplied to the flip-flops 30, 31 and 32. This is implemented by shifting the test data from the SI terminal to the flip-flops 30, 31 and 32 such that the data becomes "111" or "000" by placing the loop enabling signal at LOOPEN=0, and then by switching the loop enabling signal to LOOPEN=1. Thus, it becomes unnecessary to supply new test data from the SI terminal any more. As a result, the present embodiment 7 offers an advantage of being able to facilitate the test of the RAM 91.

Embodiments 8

Figure 8:
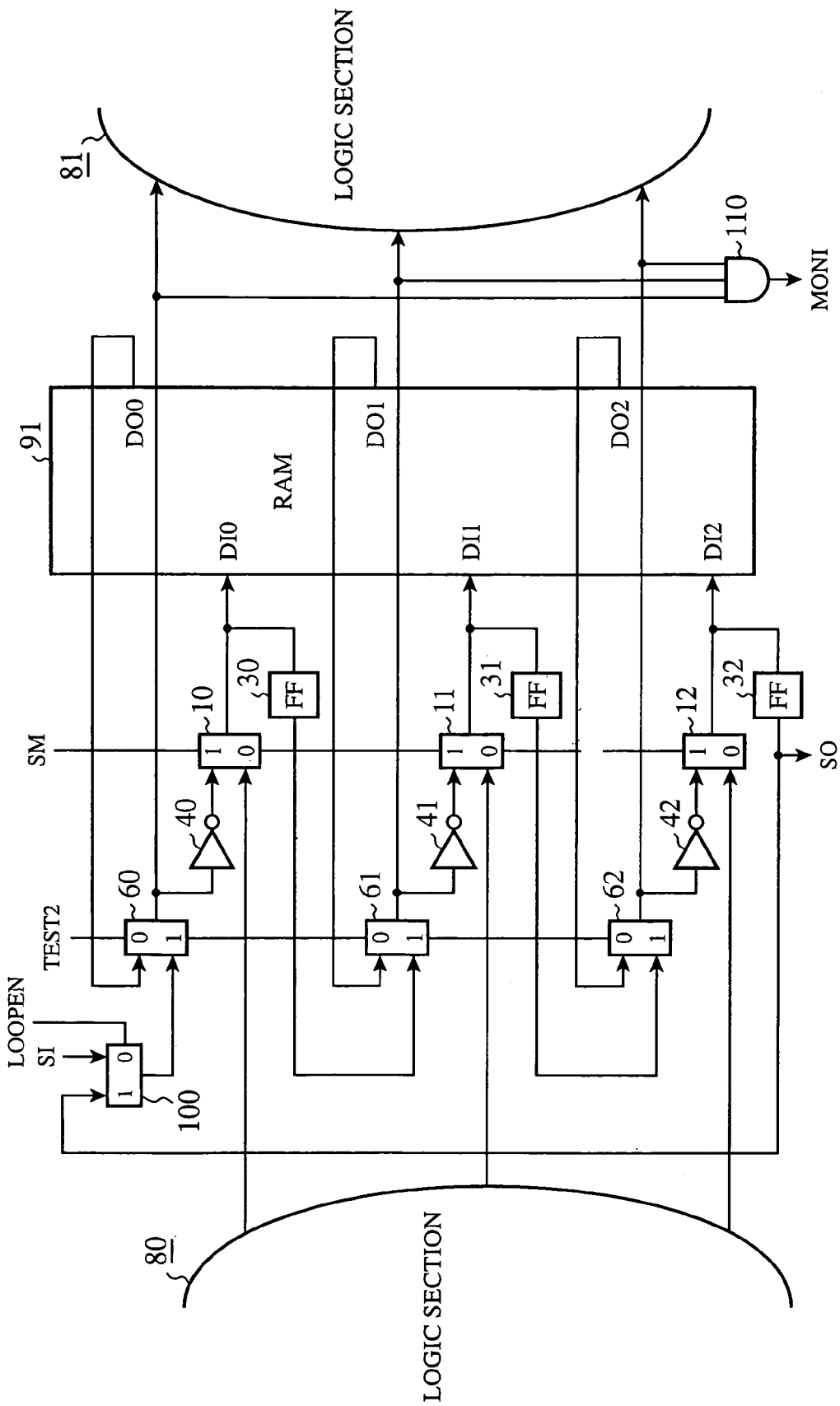
FIG. 8 is a circuit diagram showing a configuration of an embodiment 8 of the semiconductor integrated circuit in accordance with the present invention.

FIG. 8 is a circuit diagram showing a configuration of an embodiment 8 of the semiconductor integrated circuit in accordance with the present invention. As shown in FIG. 8, the present embodiment 8 includes in addition to the foregoing embodiment 7 of FIG. 7 a gate circuit 110 for monitoring the test result data output from the RAM 91 in a short time. The gate circuit 110 is provided for checking that the output data of the selectors 60, 61 and 62 have the same value. Although FIG. 8 employs an AND gate as the gate circuit 110, any of a NAND gate, OR gate and NOR gate can be used.

Next, the operation of the present embodiment 8 will be described.

The operations in the normal operation mode and in the scan test of the logic sections 80 and 81 are the same as those of the foregoing embodiment 7. In addition, the operation of the write test of the initial data to the RAM 91 is also the same as that of the embodiment 7.

Next, a read and write test from and to specified addresses of the RAM 91 will be described. The selector 100 is switched to its "1" input terminal by placing the loop enabling signal at LOOPEN=1, the selectors 10, 11 and 12 are switched to their "1" input terminals by placing the shift mode signal at SM=1, and the selectors 60, 61 and 62 are switched to their "0" input terminals by placing the test mode signal at TEST2=0.

The read test from specified addresses of the RAM 91 causes the test result data to be output from the output terminals DO0, DO1 and DO2 of the RAM 91, and then transferred to the inputs of the gate circuit 110 via the selectors 60, 61 and 62. In this case, if the test result data are "111", a monitoring signal MONI output from the gate circuit 110 becomes "1", and otherwise it becomes "0". Accordingly, checking the monitoring signal MONI makes it possible to make a decision as to whether the test result data from the output terminals DO0, DO1 and DO2 of the RAM 91 are "111" or not without shifting out the data from the SO terminal.

The test result data from the output terminals DO0, DO1 and DO2 of the RAM 91 are inverted by the inverters 40, 41 and 42 and supplied to the input terminals DI0, DI1 and DI2 of the RAM 91. Then, the inverted test result data are written into the RAM 91. At the same time, supplying the clock pulse to the flip-flops 30, 31 and 32 causes them to store the inverted test result data.

Subsequently, switching the selectors 60, 61 and 62 to their "1" input terminals by placing the test mode signal at TEST2=1 causes the inverted test result data stored in the flip-flops 32, 30 and 31 to be transferred to the inputs of the gate circuit 110 via the selectors 60, 61 and 62. If the test result data are "000", the inputs of the gate circuit 110 are placed at "111", and the gate circuit 110 outputs the monitoring signal MONI of "1". In contrast, if the test result data are other than "000", the monitoring signal MONI becomes "0". Thus, checking the monitoring signal MONI makes it possible to make a decision as to whether the test result data output from the output terminals DO0, DO1 and DO2 of the RAM 91 are "000" or not without shifting out the data from the SO terminal. The read and write test of the RAM 91 is repeated a plurality of times with changing the addresses.

As described above, the present embodiment 8 can test the RAM 91 in isolation without increasing the scale of the test circuit. In addition, it can switch the test data to be written into the RAM 91 between all zero ("000") and all one ("111") at one clock cycle. As a result, it offers an advantage of being able to test the RAM 91 efficiently. Furthermore, it offers an advantage of being able to carry out the normal operation mode without supplying the flip-flops 30, 31 and 32 with the clock signal.

Moreover, the present embodiment 8 is configured such that the data supplied to the input terminals DI0-DI2 of the RAM 91 alternate between "111" and "000" every time the clock pulse is supplied to the flip-flops 30, 31 and 32. This is implemented by shifting the test data from the SI terminal to the flip-flops 30, 31 and 32 such that the data become "111" or "000" by placing the loop enabling signal at LOOPEN=0, and then by switching the loop enabling signal to LOOPEN=1. Thus, it becomes unnecessary to supply new test data from the SI terminal any more. As a result, the present embodiment 8 offers an advantage of being able to facilitate the test of the RAM 91.

Moreover, the present embodiment 8 can decide as to whether the test result data output from the output terminals DO0, DO1 and DO2 of the RAM 91 are "111" or "000" by only checking the monitoring signal MONI without shifting the data out of the SO terminal. Accordingly, it offers an advantage of being able to facilitate the test of the RAM 91.

Embodiments 9

Figure 9:
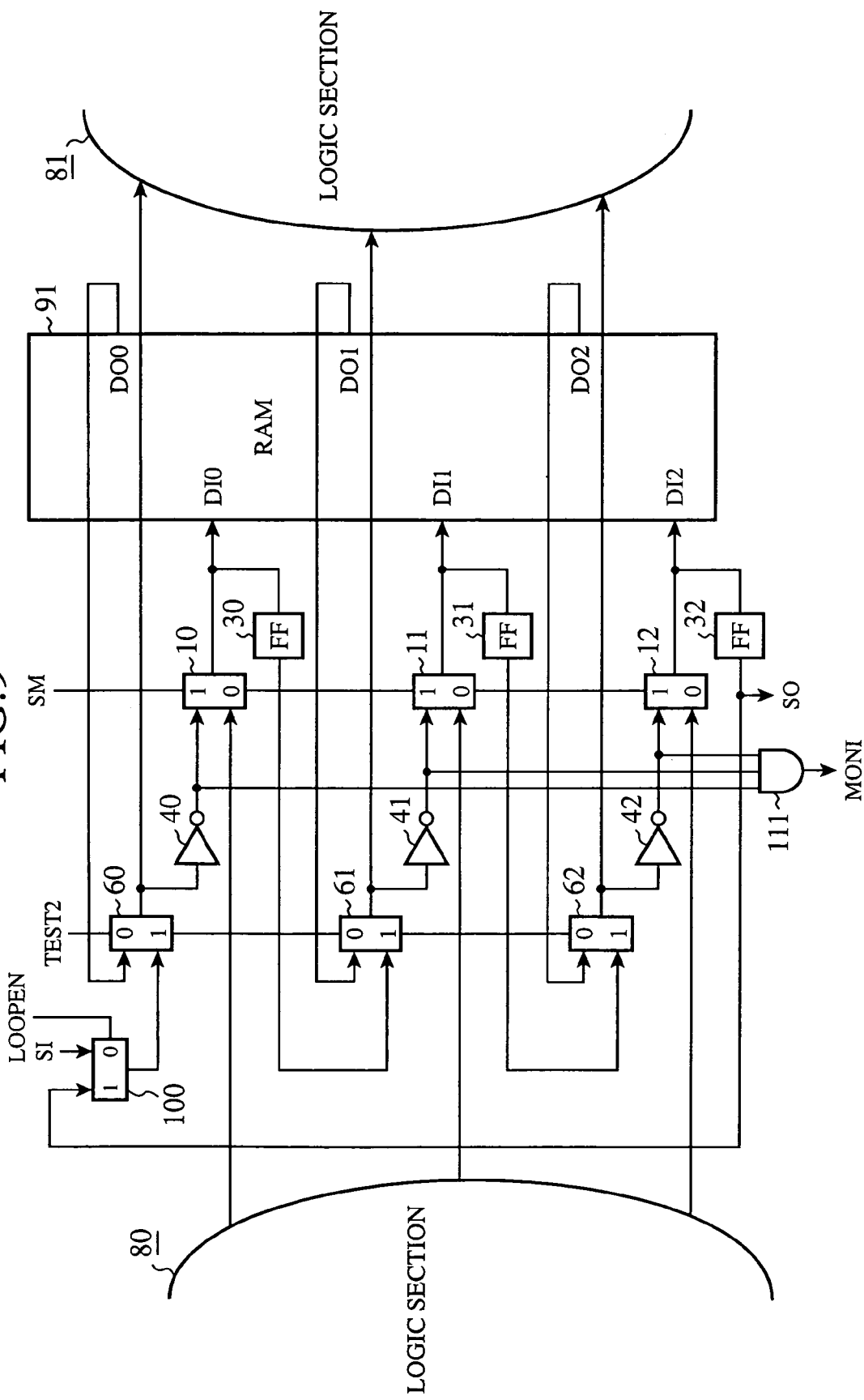
FIG. 9 is a circuit diagram showing a configuration of an embodiment 9 of the semiconductor integrated circuit in accordance with the present invention.

FIG. 9 is a circuit diagram showing a configuration of an embodiment 9 of the semiconductor integrated circuit in accordance with the present invention. As shown in FIG. 9, the present embodiment 9 includes a gate circuit 111 that corresponds to the gate circuit 110 of the foregoing embodiment 8 in FIG. 8, but is moved from the output side of the selectors 60, 61 and 62 to the output side of the inverters 40, 41 and 42. The gate circuit 111 is provided for checking that the outputs of the inverters 40, 41 and 42 have the same value. Although FIG. 9 employs an AND gate as the gate circuit 111, any of a NAND gate, OR gate and NOR gate can be used.

Next, the operation of the present embodiment 9 will be described.

The operations in the normal operation mode and in the scan test of the logic sections 80 and 81 are the same as those of the foregoing embodiment 7. In addition, the operation of the write test of the initial data to the RAM 91 is also the same as that of the embodiment 7.

Next, a read and write test from and to specified addresses of the RAM 91 will be described. The selector 100 is switched to its "1" input terminal by placing the loop enabling signal at LOOPEN=1, the selectors 10, 11 and 12 are switched to their "1" input terminals by placing the shift mode signal at SM=1, and the selectors 60, 61 and 62 are switched to their "0" input terminals by placing the test mode signal at TEST2=0.

The read test from specified addresses of the RAM 91 causes the test result data to be output from the output terminals DO0, DO1 and DO2 of the RAM 91, and then transferred to the inputs of the gate circuit 111 via the selectors 60, 61 and 62 and inverters 40, 41 and 42 that invert the test result data. In this case, if the test result data is "000", a monitoring signal MONI output from the gate circuit 111 becomes "1", and otherwise it becomes "0". Accordingly, checking the monitoring signal MONI makes it possible to make a decision as to whether the test result data from the output terminals DO0, DO1 and DO2 of the RAM 91 are "000" or not without shifting out the data from the SO terminal.

The test result data from the output terminals DO0, DO1 and DO2 of the RAM 91 are inverted by the inverters 40, 41 and 42 and supplied to the input terminals DI0, DI1 and DI2 of the RAM 91. Then, the inverted test result data are written into the RAM 91. At the same time, supplying one clock pulse to the flip-flops 30, 31 and 32 causes them to store the inverted test result data.

Subsequently, switching the selectors 60, 61 and 62 to their "1" input terminals by placing the test mode signal at TEST2=1 causes the inverted test result data stored in the flip-flops 32, 30 and 31 to be transferred to the selectors 60, 61 and 62. The inverted test result data output from the selectors 60, 61 and 62 are transferred to the gate circuit 111 after inverted by the inverters 40, 41 and 42, again. If the test result data are "111", the inputs of the gate circuit 111 are placed at "111", and the gate circuit 111 outputs the monitoring signal MONI of "1". In contrast, if the test result data are other than "111", the monitoring signal MONI becomes "0". Thus, checking the monitoring signal MONI makes it possible to make a decision as to whether the test result data output from the output terminals DO0, DO1 and DO2 of the RAM 91 are "111" or not without shifting out the data from the SO terminal. The read and write test of the RAM 91 is repeated a plurality of times with changing the addresses.

As described above, the present embodiment 9 can test the RAM 91 in isolation without increasing the scale of the test circuit. In addition, it can switch the test data to be written into the RAM 91 between all zero ("000") and all one ("111") at one clock cycle. As a result, it offers an advantage of being able to test the RAM 91 efficiently. Furthermore, it offers an advantage of being able to carry out the normal operation mode without supplying the flip-flops 30, 31 and 32 with the clock signal.

Moreover, the present embodiment 9 is configured such that the data supplied to the input terminals DI0–DI2 of the RAM 91 alternate between "111" and "000" every time the clock pulse is supplied to the flip-flops 30, 31 and 32. This is implemented by shifting the test data from the SI terminal to the flip-flops 30, 31 and 32 such that the data become "111" or "000" by placing the loop enabling signal at LOOPEN=0, and then by switching the loop enabling signal to LOOPEN=1. Thus, it becomes unnecessary to supply new test data from the SI terminal any more. As a result, the present embodiment 9 offers an advantage of being able to facilitate the test of the RAM 91.

Moreover, the present embodiment 9 can decide as to whether the test result data output from the output terminals DO0, DO1 and DO2 of the RAM 91 are "000" or "111" by only checking the monitoring signal MONI without shifting the data out of the SO terminal. Accordingly, it offers an advantage of being able to facilitate the test of the RAM 91.

Embodiment 10

Figure 10:
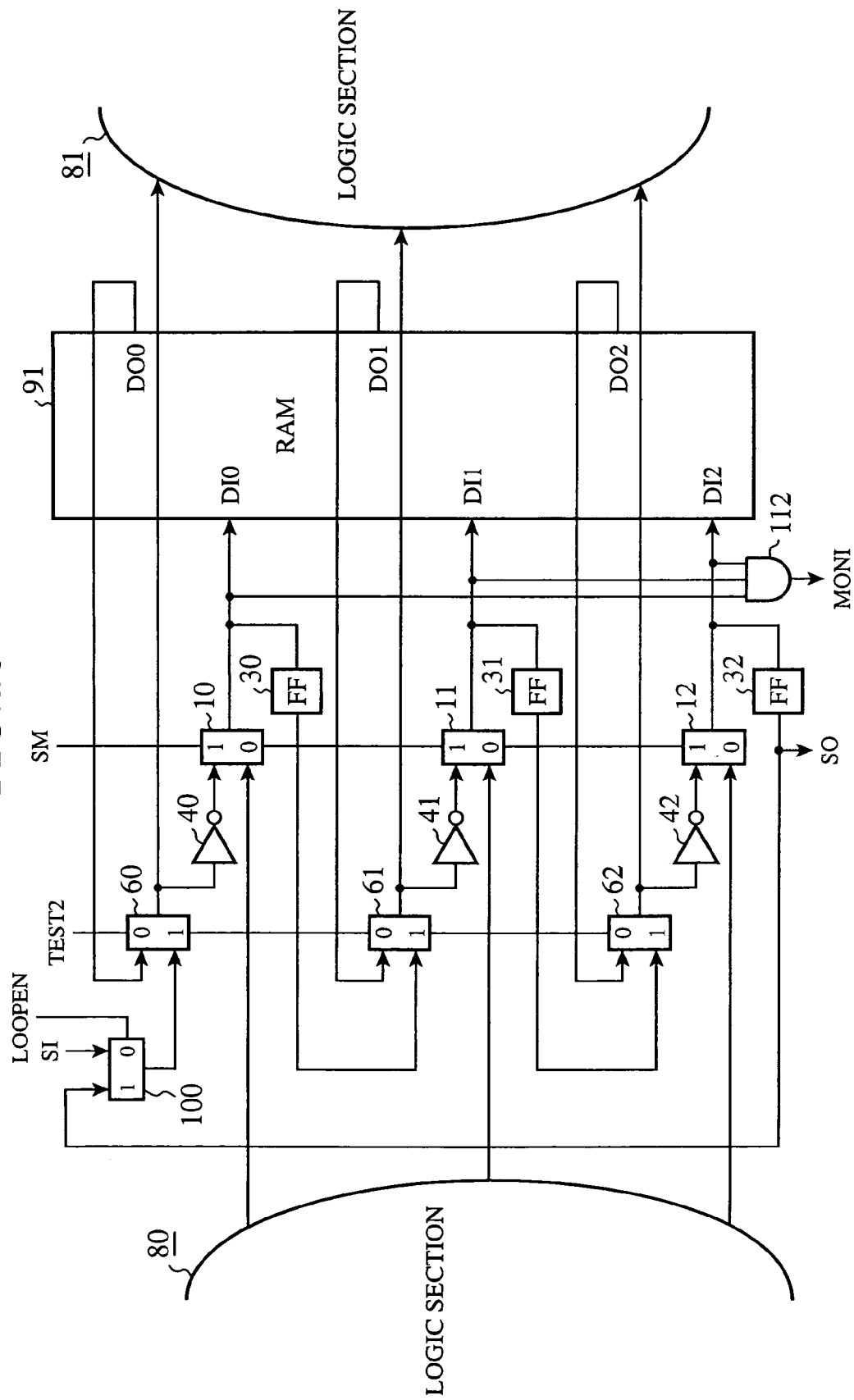
FIG. 10 is a circuit diagram showing a configuration of an embodiment 10 of the semiconductor integrated circuit in accordance with the present invention.

FIG. 10 is a circuit diagram showing a configuration of an embodiment 10 of the semiconductor integrated circuit in accordance with the present invention. As shown in FIG. 10, the present embodiment 10 includes a gate circuit 112 that corresponds to the gate circuit 110 of the foregoing embodiment 8 in FIG. 8, but is moved from the output side of the selectors 60, 61 and 62 to the output side of the selectors 10, 11 and 12. The gate circuit 112 is provided for checking that the outputs of the selectors 10, 11 and 12 have the same value. Although FIG. 10 employs an AND gate as the gate circuit 112, any of a NAND gate, OR gate and NOR gate can be used.

Next, the operation of the present embodiment 10 will be described.

The operations in the normal operation mode and in the scan test of the logic sections 80 and 81 are the same as those of the foregoing embodiment 7. In addition, the operation of the write test of the initial data to the RAM 91 is also the same as that of the embodiment 7. Furthermore, a read and write test from and to specified addresses of the RAM 91 is the same as that of the foregoing embodiment 9 except that the gate circuit 112 makes a decision as to whether the test result data output from the output terminals DO0, DO1 and DO2 of the RAM 91 are "000" or "111" from the data output from the selectors 10, 11 and 12.

As described above, the present embodiment 10 offers the same advantages as the embodiment 9.

Embodiment 11

Figure 11:
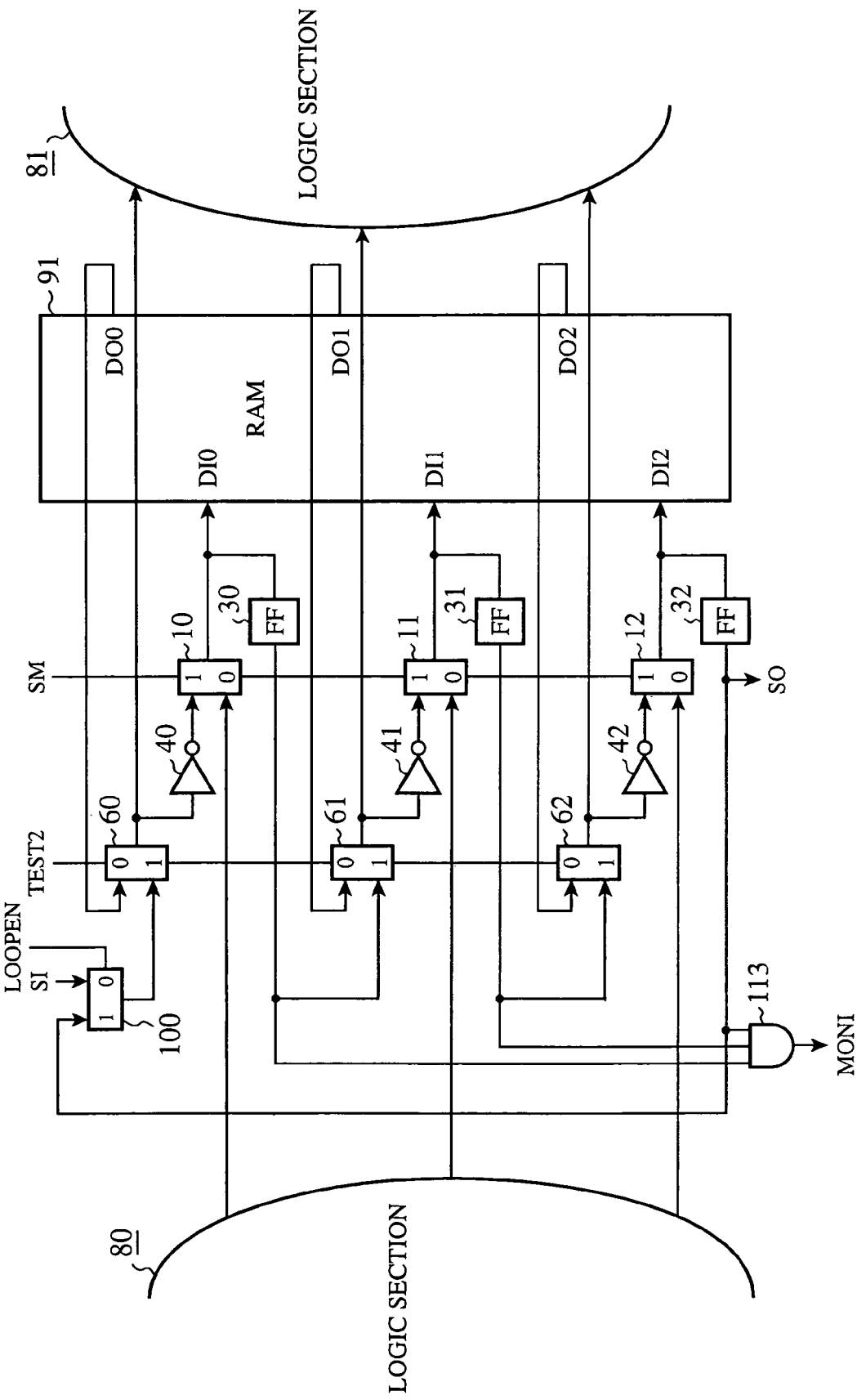
FIG. 11 is a circuit diagram showing a configuration of an embodiment 11 of the semiconductor integrated circuit in accordance with the present invention.

FIG. 11 is a circuit diagram showing a configuration of an embodiment 11 of the semiconductor integrated circuit in accordance with the present invention. As shown in FIG. 11, the present embodiment 11 includes a gate circuit 113 that corresponds to the gate circuit 110 of the foregoing embodiment 8 in FIG. 8, but is moved from the output side of the selectors 60, 61 and 62 to the output side of the flip-flops 30, 31 and 32. The gate circuit 113 is provided for checking that the outputs of the flip-flops 30, 31 and 32 have the same value. Although FIG. 11 employs an AND gate as the gate circuit 113, any of a NAND gate, OR gate and NOR gate can be used.

Next, the operation of the present embodiment 11 will be described.

The operations in the normal operation mode and in the scan test of the logic sections 80 and 81 are the same as those of the foregoing embodiment 7. In addition, the operation of the write test of the initial data to the RAM 91 is also the same as that of the embodiment 7.

Next, a read and write test from and to specified addresses of the RAM 91 will be described. The selector 100 is switched to its "1" input terminal by placing the loop enabling signal at LOOPEN=1, the selectors 10, 11 and 12 are switched to their "1" input terminals by placing the shift mode signal at SM=1, and the selectors 60, 61 and 62 are switched to their "0" input terminals by placing the test mode signal at TEST2=0.

The read test from specified addresses of the RAM 91 causes the test result data to be output from the output terminals DO0, DO1 and DO2 of the RAM 91. The test result data pass through the selectors 60, 61 and 62 and selectors 10, 11 and 12 and are inverted by the inverters 40, 41 and 42. Then, the inverted test result data are supplied to the inputs of the flip-flops 30, 31 and 32 and to the input terminals DI0, DI1 and DI2 of the RAM 91.

Subsequently, the inverted test result data are written into the RAM 91. At the same time, supplying one clock pulse to the flip-flops 30, 31 and 32 causes them to store the inverted test result data. Thus, the inverted test result data are transferred to the inputs of the gate circuit 113.

In this case, if the test result data are "000", the output data of the flip-flops 30, 31 and 32 are placed at "111", and the gate circuit 113 outputs the monitoring signal MONI of "1". In contrast, if the test result data are other than "000", the monitoring signal MONI becomes "0". Thus, checking the monitoring signal MONI makes it possible to make a decision as to whether the test result data output from the output terminals DO0, DO1 and DO2 of the RAM 91 are "000" or not without shifting out the data from the SO terminal.

Subsequently, switching the selectors 60, 61 and 62 to their "1" input terminals by placing the test mode signal at TEST2=1 causes the inverted test result data stored in the flip-flops 32, 30 and 31 to be transferred to the selectors 60, 61 and 62. The inverted test result data output from the selectors 60, 61 and 62 are inverted by the inverters 40, 41 and 42, again, to become the test result data, which are transferred to the inputs of the flip-flops 30, 31 and 32 via the selectors 10, 11 and 12. Then, supplying one clock pulse to the flip-flops 30, 31 and 32 causes them to store the test result data, and to transfer the test result data to the inputs of the gate circuit 113.

If the test result data are "111", the inputs of the gate circuit 113 are placed at "111", and the gate circuit 113 outputs the monitoring signal MONI of "1". In contrast, if the test result data are other than "111", the monitoring signal MONI becomes "0". Thus, checking the monitoring signal MONI makes it possible to make a decision as to whether the test result data output from the output terminals DO0, DO1 and DO2 of the RAM 91 are "111" or not without shifting out the data from the SO terminal. The read and write test of the RAM 91 is repeated a plurality of times with changing the addresses.

As described above, the present embodiment 11 offers the same advantages as those of the embodiment 9.

Embodiment 12

Figure 12:
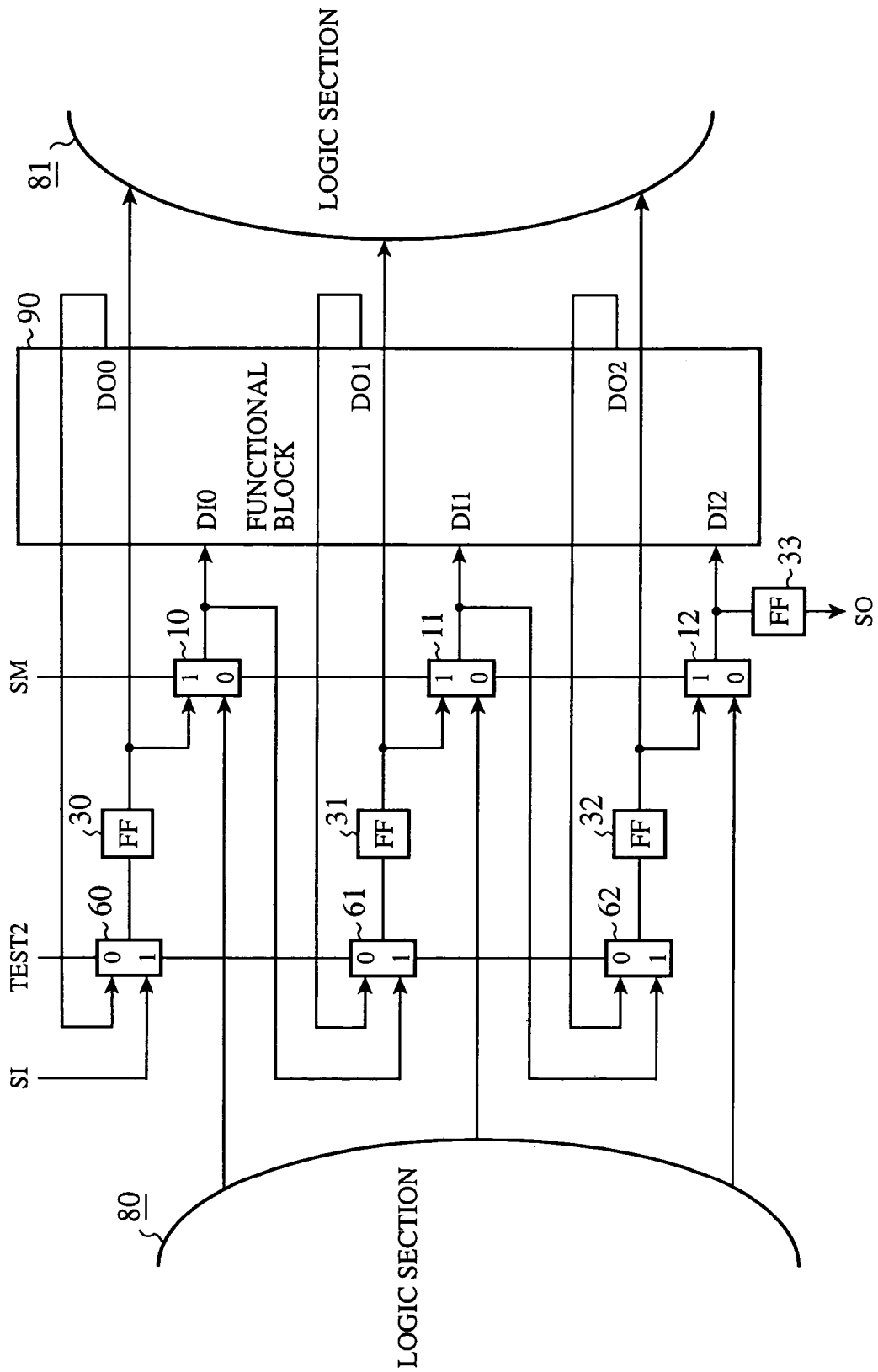
FIG. 12 is a circuit diagram showing a configuration of an embodiment 12 of the semiconductor integrated circuit in accordance with the present invention.

FIG. 12 is a circuit diagram showing a configuration of an embodiment 12 of the semiconductor integrated circuit in accordance with the present invention. In the embodiment 4 of FIG. 4, the inputs of the flip-flops 30, 31 and 32 are connected to the outputs of the selectors 10, 11 and 12. In contrast, in the present embodiment 12 as shown in FIG. 12, the inputs of the flip-flops 30, 31 and 32 are connected to the outputs of the selectors 60, 61 and 62, the outputs of the flip-flops 30, 31 and 32 are connected to the logic section 81, and a flip-flop 33 is added between the output of the selector 12 and the SO terminal. This makes it possible for the normal operation mode to use the flip-flops 30, 31 and 32 as the output register of the functional block 90 in the normal operation mode without increasing the circuit scale.

Next, the operation will be described.

In the normal operation mode, the selectors 10, 11 and 12 are switched to their "0" input terminals by placing the shift mode signal at SM=0, and selectors 60, 61 and 62 are also switched to their "0" input terminals by placing the test mode signal at TEST2=0. In this state, the data output from the logic section 80 are selected by the selectors 10, 11 and 12 to be supplied directly to the input terminals DI0, DI1 and DI2 of the functional block 90.

The data from the output terminals DO0, DO1 and DO2 of the functional block 90 are selected by the selectors 60, 61 and 62 to be delivered to the inputs of the flip-flops 30, 31 and 32. Since the outputs of the flip-flops 30, 31 and 32 are connected to the logic section 81, the functional block 90 and flip-flops 30, 31 and 32 are interposed between the logic sections 80 and 81 in the normal operation mode. Thus, feeding the flip-flops 30, 31 and 32 with the clock signal enables the prescribed computation and data processing. In this case, the flip-flops 30, 31 and 32 operate as the output register of the functional block 90.

In the scan test mode of the logic sections 80 and 81, the selectors 60, 61 and 62 are switched to their "1" input terminals by placing the test mode signal at TEST2=1. In this state, the functional block 90 is bypassed, and the scan path is interposed between the logic sections 80 and 81. The scan test of the logic sections 80 and 81 is carried out with controlling the shift mode signal SM.

In the scan test mode of the logic section 81, the selectors 10, 11 and 12 are switched to their "1" input terminals by placing the shift mode signal at SM=1. Accordingly, supplying three clock pulses to the flip-flops 30, 31 and 32 (and to the flip-flop 33 if desired) causes the 3-bit test data from the SI terminal to be shifted serially and stored into the flip-flops 30, 31 and 32.

The 3-bit test data output from the flip-flops 30, 31 and 32 are input to the logic section 81, and the logic section 81 carries out the specified operation. The output of the logic section 81 is connected to another scan path or output buffer of an LSI not shown to undergo a test in the conventional method.

The scan test of the logic section 80 will be described. The input of the logic section 80 is connected to the flip-flop outputs of another scan path or to the input buffer of an LSI so that the test data are supplied in the conventional method. The logic section 80 carries out the specified operation according to the test data, and the test result output of the logic section 80 is delivered to the "0" input terminals of the selectors 10, 11 and 12. The selectors 10, 11 and 12 are switched to their "0" input terminals by placing the shift mode signal at SM=0. Then, the flip-flops 31, 32 and 33 (and the flip-flop 30, if desired) are supplied with one clock pulse so that the flip-flops 30, 31 and 32 store the 3-bit data output as the test result from the logic section 80. In this case, the 1-bit data stored in the flip-flop 33 is output from the SO terminal.

Subsequently, the selectors 10, 11 and 12 are switched to their "1" input terminals by placing the shift mode signal at SM=1. Then, supplying the flip-flops 30, 31 and 32 (and flip-flop 30, if desired) with two clock pulses causes the individual 1-bit data stored in the flip-flops 31 and 32 to be shifted and output serially from the SO terminal, thereby enabling the confirmation of the contents of the total of 3-bit data. In this case, the next test data for the logic section 81 can be stored in the flip-flops 30 and 31 via the SI terminal. The scan test of the logic sections 80 and 81 is repeated a plurality of times with changing the input test data.

To carry out the test of the functional block 90, the selectors 10, 11 and 12 are switched to their "1" input terminals by placing the shift mode signal at SM=1. Then, the selectors 60, 61 and 62 are switched to their "1" input terminals by placing the test mode signal at TEST2=1. In this state, supplying three clock pulses to the flip-flops 30, 31 and 32 (and to the flip-flop 33, if desired) causes the 3-bit test data from the SI terminal to be serially shifted to the flip-flops 30, 31 and 32.

Then, the 3-bit test data stored in the flip-flops 30, 31 and 32 are selected by the selectors 10, 11 and 12, and supplied to the input terminals DI0, DI1 and DI2 of the functional block 90. The functional block 90 carries out the specified operation (with being supplied with the clock signal if necessary), and the test result data are output from the output terminals DO0, DO1 and DO2.

Next, the selectors 60, 61 and 62 are switched to their "0" input terminals by placing the test mode signal at TEST2=0. Supplying one clock pulse to the flip-flops 30, 31 and 32 causes them to store the test result data output from the output terminals DO0, DO1 and DO2 of the functional block 90.

Subsequently, the selectors 60, 61 and 62 are switched to their "1" input terminals by placing the test mode signal at TEST2=1. Supplying three clock pulses to the flip-flops 31, 32 and 33 (and to the flip-flop 30 if desired) causes the individual 1-bit data stored in the flip-flops 30, 31 and 32 to be shifted out from the SO terminal, thereby making it possible to confirm the contents of the total of 3-bit data. The test of the functional block 90 is repeated a plurality of times with changing the test data input from the SI terminal.

As described above, the present embodiment 12 offers an advantage of being able to test the functional block 90 in isolation without increasing the scale of the test circuit. In addition, it offers an advantage of enabling the normal operation mode to utilize the flip-flops 30, 31 and 32 as the output register of the functional block 90 in the normal operation mode without increasing the circuit scale.

Embodiment 13

Figure 13:
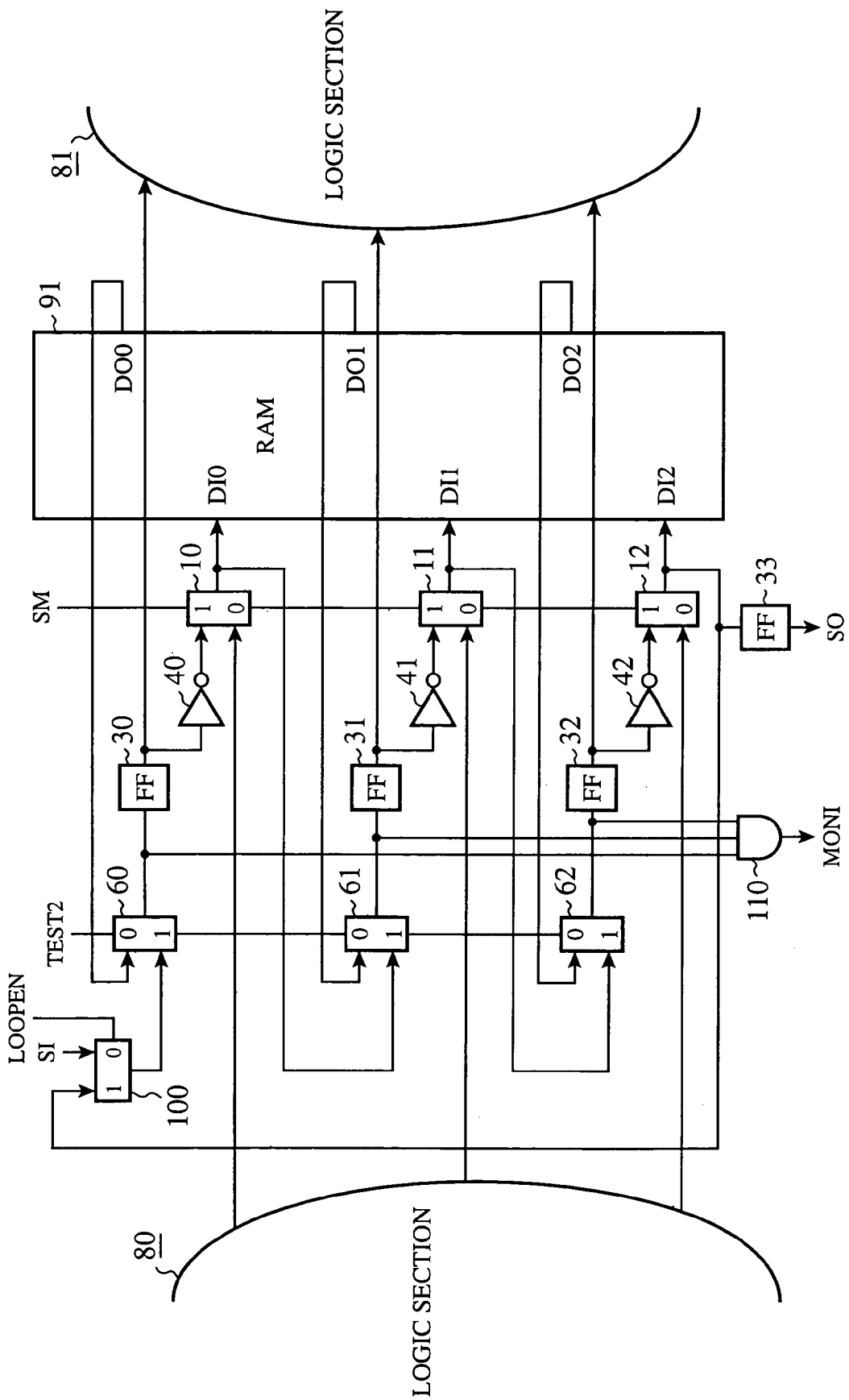
FIG. 13 is a circuit diagram showing a configuration of an embodiment 13 of the semiconductor integrated circuit in accordance with the present invention.

FIG. 13 is a circuit diagram showing a configuration of an embodiment 13 of the semiconductor integrated circuit in accordance with the present invention. In the embodiment 8 of FIG. 8, the inputs of the flip-flops 30, 31 and 32 are connected to the outputs of the selectors 10, 11 and 12. In contrast, in the present embodiment 13 shown in FIG. 13, the inputs of the flip-flops 30, 31 and 32 are connected to the outputs of the selectors 60, 61 and 62, the outputs of the flip-flops 30, 31 and 32 are connected to the logic section 81, and a flip-flop 33 is added between the output of the selector 12 and the SO terminal. This makes it possible for the normal operation mode to use the flip-flops 30, 31 and 32 as the output register of the RAM 91 in the normal operation mode without increasing the circuit scale. Although an AND gate is used as a gate circuit 110 in FIG. 13, any one of the NAND gate, OR gate and NOR gate can be used.

Next, the operation will be described.

In the normal operation mode, the selectors 10, 11 and 12 are switched to their "0" input terminals by placing the shift mode signal at SM=0, and the selectors 60, 61 and 62 are also switched to their "0" input terminals by placing the test mode signal at TEST2=0. In this state, the data output from the logic section 80 are selected by the selectors 10, 11 and 12 to be supplied directly to the input terminals DI0, DI1 and DI2 of the RAM 91.

The data from the output terminals DO0, DO1 and DO2 of the RAM 91 are selected by the selectors 60, 61 and 62 to be delivered to the inputs of the flip-flops 30, 31 and 32. Since the outputs of the flip-flops 30, 31 and 32 are connected to the logic section 81, the RAM 91 and flip-flops 30, 31 and 32 are interposed between the logic sections 80 and 81 in the normal operation mode. Thus, feeding the flip-flops 30, 31 and 32 with the clock signal enables the prescribed computation and data processing. In this case, the flip-flops 30, 31 and 32 operate as the output register of the RAM 91.

In the scan test mode of the logic sections 80 and 81, the selector 100 is switched to its "0" input terminal by placing the loop enabling signal at LOOPEN=0 and the selectors 60, 61 and 62 are switched to their "1" input terminals by placing the test mode signal at TEST2=1. In this state, the RAM 91 is bypassed, and the scan path is interposed between the logic sections 80 and 81. The scan test of the logic sections 80 and 81 is carried out with controlling the shift mode signal SM.

In the scan test mode of the logic section 81, the selectors 10, 11 and 12 are switched to their "1" input terminals by placing the shift mode signal at SM=1. Thus, supplying three clock pulses to the flip-flops 30, 31 and 32 (and to the flip-flop 33 if desired) causes the 3-bit test data from the SI terminal to be shifted serially and stored into the flip-flops 30, 31 and 32. In this case, it is necessary to feed appropriate test data considering the inverters 40, 41 and 42 interposed into the serial shift path.

The 3-bit test data output from the flip-flops 30, 31 and 32 are input to the logic section 81, and the logic section 81 carries out the specified operation. The output of the logic section 81 is connected to another scan path or output buffer of an LSI not shown to undergo a test in the conventional method.

The scan test of the logic section 80 will be described. The input of the logic section 80 is connected to the flip-flop outputs of another scan path or to the input buffer of an LSI so that the test data are supplied in the conventional method. The logic section 80 carries out the specified operation according to the test data, and the test result output of the logic section 80 is delivered to the "0" input terminals of the selectors 10, 11 and 12. The selectors 10, 11 and 12 are switched to their "0" input terminals by placing the shift mode signal at SM=0. Then, the flip-flops 31, 32 and 33 (and the flip-flop 30 if desired) are supplied with one clock pulse so that the flip-flops 30, 31 and 32 store the 3-bit data output as the test result from the logic section 80. In this case, the 1-bit data stored in the flip-flop 33 is output from the SO terminal.

Subsequently, the selectors 10, 11 and 12 are switched to their "1" input terminals by placing the shift mode signal at SM=1. Then, supplying the flip-flops 30, 31 and 32 (and flip-flop 30 if desired) with two clock pulses causes the individual 1-bit data stored in the flip-flops 31 and 32 to be shifted and output serially from the SO terminal, thereby enabling the confirmation of the contents of the total of 3-bit data. In this case, the next test data for the logic section 81 can be stored in the flip-flops 30 and 31 via the SI terminal. In addition, it is necessary to supply appropriate data considering the inverters 40, 41 and 42 interposed into the serial shift path. The scan test of the logic sections 80 and 81 is repeated a plurality of times with changing the input test data.

Next, the test of the RAM 91 will be described.

First, a write test of the initial data to the RAM 91 will be described. The selector 100 is switched to its "0" input terminal by placing the loop enabling signal at LOOPEN=0, the selectors 10, 11 and 12 are switched to their "1" input terminals by placing the shift mode signal at SM=1, and the selectors 60, 61 and 62 are switched to their "1" input terminals by placing the test mode signal at TEST2=1.

Supplying three clock pulses to the flip-flops 30, 31 and 32 causes them to store the 3-bit test data fed from the SI terminal by the serial shift operation. In this case, since the flip-flop 31 stores the inverted test data, when the test data "101" is shifted in from the SI terminal, the flip-flops 30, 31 and 32 output the data "111". The outputs of the flip-flops 30, 31 and 32 are inverted by the inverters 40, 41 and 42 and selected by the selectors 10, 11 and 12 so that the data "000" is supplied to the input terminals DI0, DI1 and DI2 of the RAM 91.

Subsequently, the selector 100 is switched to its "1" input terminal by placing the loop enabling signal at LOOPEN=1.

Then, every time the clock pulse is supplied to the flip-flops 30, 31 and 32, the data of the input terminals DI0, DI1 and DI2 of the RAM 91 are varied between the "000" state and "111" state by the inverters 40, 41 and 42. When the intended test data "000" or "111" are set, the write operation of the RAM 91 is carried out. The test data write to the RAM 91 is repeated a plurality of times with varying the addresses.

Next, a read and write test from and to specified addresses of the RAM 91 will be described. The selector 100 is switched to its "1" input terminal by placing the loop enabling signal at LOOPEN=1, the selectors 10, 11 and 12 are switched to their "1" input terminals by placing the shift mode signal at SM=1, and the selectors 60, 61 and 62 are switched to their "0" input terminals by placing the test mode signal at TEST2=0.

The read test from the specified addresses of the RAM 91 causes the test result data to be output from the output terminals DO0, DO1 and DO2 of the RAM 91, and transferred to the input of the gate circuit 110 via the selectors 60, 61 and 62. If the test result data are "111", the monitor signal MONI output from the gate circuit 110 becomes "1", and if the test result data is not "111", the monitor signal MONI becomes "0". Accordingly, checking the monitor signal MONI makes it possible to decide as to whether the test result data from the output terminals DO0, DO1 and DO2 of the RAM 91 are "111" or not without shifting from the SO terminal.

Next, receiving one clock pulse, the flip-flops 30, 31 and 32 store the test result data. Subsequently, when the selectors 60, 61 and 62 are switched to the "1" input terminals by placing the test mode signal at TEST2=1, the data stored in the flip-flops 30, 31 and 32 are inverted by the inverters 42, 40, 41, selected by the selectors 12, 10 and 11, and transferred to the input terminals DI2, DI0 and DI1 of the RAM 91 and to the "1" input terminals of the selectors 60, 61 and 62. In this case, the data stored in the flip-flop 32 passes through the "1" input terminal of the selector 100.

In this case, if the test result data of the RAM 91 are "000", the monitoring signal MONI output from the gate circuit 110 becomes "1", and otherwise it becomes "0". Accordingly, checking the monitoring signal MONI makes it possible to decide as to whether the test result data from the output terminals DO0, DO1 and DO2 of the RAM 91 are "000" or not without shifting out the data from the SO terminal.

Subsequently, the inverted test result data ("000" or "111" in the case without a failure) is written into the RAM 91. The read and write test of the RAM 91 is repeated a plurality of times with changing the addresses.

As described above, the present embodiment 13 can test the RAM 91 in isolation without increasing the scale of the test circuit. In addition, it can switch the test data to be written into the RAM 91 between all zero ("000") and all one ("111") at one clock cycle. As a result, it offers an advantage of being able to test the RAM 91 efficiently.

Moreover, the present embodiment 13 is configured such that the data supplied to the input terminals DI0–DI2 of the RAM 91 alternate between "111" and "000" every time the clock pulse is supplied to the flip-flops 30, 31 and 32. This is implemented by shifting the test data from the SI terminal to the flip-flops 30, 31 and 32 such that the data become "111" or "000" by placing the loop enabling signal at LOOPEN=0, and then by switching the loop enabling signal to LOOPEN=1. Thus, it becomes unnecessary to supply new test data from the SI terminal any more. As a result, the present embodiment 13 offers an advantage of being able to facilitate the test of the RAM 91.

Moreover, the present embodiment 13 can decide as to whether the test result data output from the output terminals DO0, DO1 and DO2 of the RAM 91 are "111" or "000" by only checking the monitoring signal MONI without shifting the data out of the SO terminal. Accordingly, it offers an advantage of being able to facilitate the test of the RAM 91.

Furthermore, the present embodiment 13 offers an advantage of enabling the normal operation mode to utilize the flip-flops 30, 31 and 32 as the output register of the RAM 91 in the normal operation mode without increasing the circuit scale.

Embodiment 14

Figure 14:
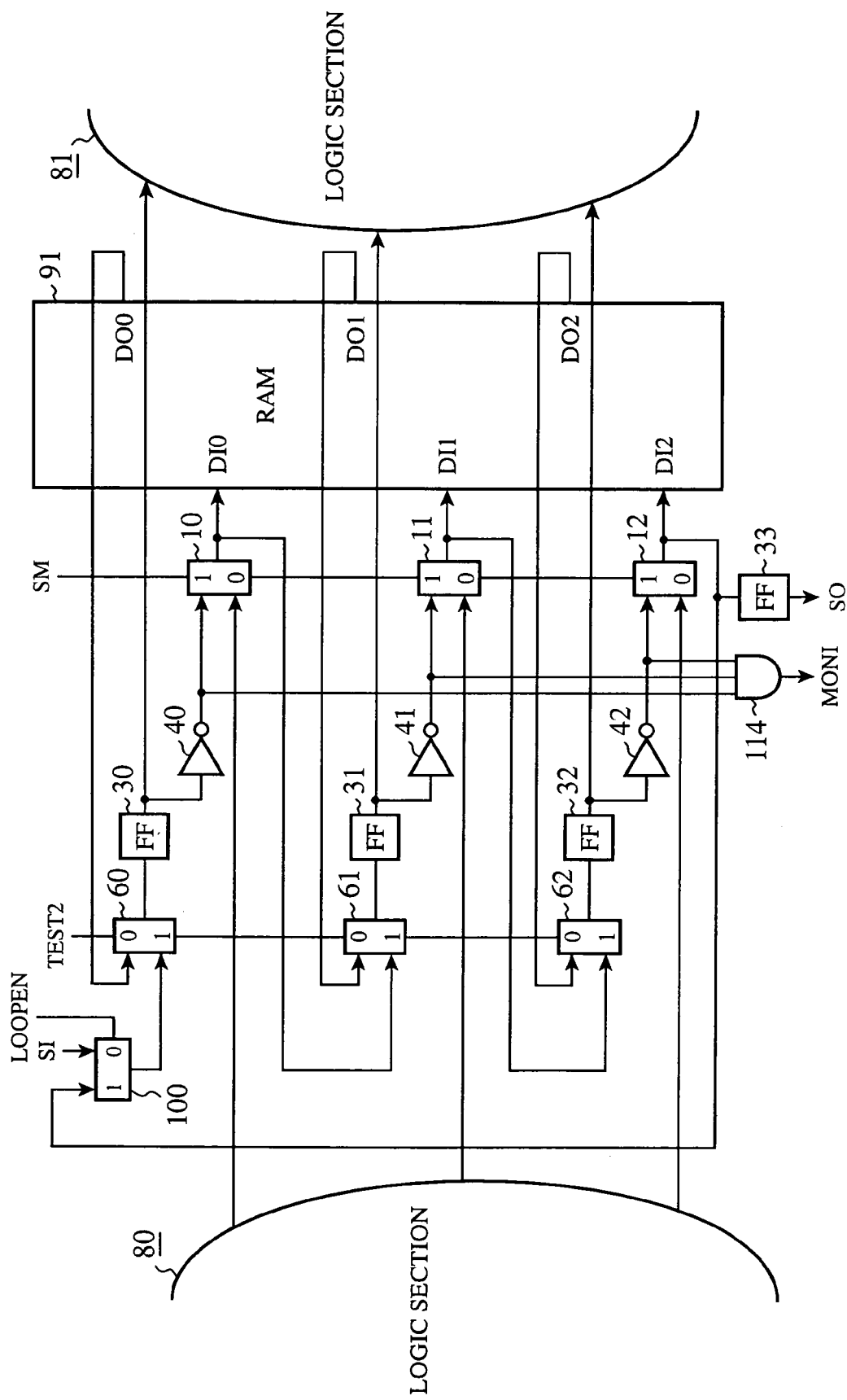
FIG. 14 is a circuit diagram showing a configuration of an embodiment 14 of the semiconductor integrated circuit in accordance with the present invention.

FIG. 14 is a circuit diagram showing a configuration of an embodiment 14 of the semiconductor integrated circuit in accordance with the present invention. In the present embodiment 14 as shown in FIG. 14, the gate circuit 110 of the embodiment 13 shown in FIG. 13 is moved from the output side of the selectors 60, 61 and 62 to the output side of the inverters 40, 41 and 42 as a gate circuit 114. The gate circuit 114 is provided to detect as to whether the values of the outputs of the inverters 40, 41 and 42 are equal. Thus, the test of the RAM 91 should be carried out considering this. In FIG. 14, although an AND gate is used as the gate circuit 114, any one of the NAND gate, OR gate and NOR gate can replace it. In addition, the flip-flops 30, 31 and 32 can be utilized as the output register of the RAM 91 in the normal operation mode in FIG. 14 as in FIG. 13.

Next, the operation of the present embodiment 14 will be described.

The operations in the normal operation mode and in the scan test mode of the logic sections 80 and 81 are the same as those of the embodiment 13. In addition, the operation of the write test of the initial data to the RAM 91 in the test of the RAM 91 is the same as that of the embodiment 13.

Next, a read and write test from and to specified addresses of the RAM 91 will be described. The selector 100 is switched to its "1" input terminal by placing the loop enabling signal at LOOPEN=1, the selectors 10, 11 and 12 are switched to their "1" input terminals by placing the shift mode signal at SM=1, and the selectors 60, 61 and 62 are switched to their "0" input terminals by placing the test mode signal at TEST2=0.

The read test from the specified addresses of the RAM 91 causes the test result data to be output from the output terminals DO0, DO1 and DO2 of the RAM 91, and transferred to the inputs of the flip-flops 30, 31 and 32 via the selectors 60, 61 and 62. Receiving one clock pulse, the flip-flops 30, 31 and 32 store the test result data. The test result data stored in the flip-flops 30, 31 and 32 are inverted by the inverters 40, 41 and 42, and transferred to the input of the gate circuit 114.

In this case, if the test result data are "000", the monitoring signal MONI output from the gate circuit 114 becomes "1", and otherwise it becomes "0". Accordingly, checking the monitoring signal MONI makes it possible to decide as to whether the test result data from the output terminals DO0, DO1 and DO2 of the RAM 91 are "000" or not without shifting out the data from the SO terminal.

Then, the selectors 60, 61 and 62 are switched to their "1" input terminals by placing the test mode signal at TEST2=1. In this state, writing the inverted test result data into the RAM 91 and supplying one clock pulse to the flip-flops 30, 31 and 32 cause the data stored in the flip-flops 30, 31 and 32 to be inverted by the inverters 42, 40 and 41, selected by the selectors 12, 10 and 11, passed through the "1" input terminals of the selectors 60, 61 and 62, and captured by the flip-flops 30, 31 and 32 to be output. In this case, the data stored in the flip-flop 32 passes through the "1" input terminal of the selector 100.

The output data of the flip-flops 30, 31 and 32 are inverted by the inverters 40, 41 and 42 and transferred to the input of the gate circuit 114. Accordingly, if the outputs of the flip-flops 30, 31 and 32 are "000" (that is, if the test result data are "111"), the monitor signal MONI output from the gate circuit 114 becomes "1", and unless the test result data of the RAM 91 is "111", the monitor signal MONI becomes "0". Therefore checking the monitoring signal MONI makes it possible to make a decision as to whether the test result data output from the output terminals DO0, DO1 and DO2 of the RAM 91 are "111" or not without shifting out the data from the SO terminal. The read and write test of the RAM 91 is repeated a plurality of times with changing the addresses.

As described above, the present embodiment 14 can test the RAM 91 in isolation without increasing the scale of the test circuit. In addition, it can switch the test data to be written into the RAM 91 between all zero ("000") and all one ("111") at one clock cycle. As a result, it offers an advantage of being able to test the RAM 91 efficiently.

Moreover, the present embodiment 14 is configured such that the data supplied to the input terminals DI0–DI2 of the RAM 91 alternate between "111" and "000" every time the clock pulse is supplied to the flip-flops 30, 31 and 32. This is implemented by shifting the test data from the SI terminal to the flip-flops 30, 31 and 32 such that the data become "111" or "000" by placing the loop enabling signal at LOOPEN=0, and then by switching the loop enabling signal to LOOPEN=1. Thus, it becomes unnecessary to supply new test data from the SI terminal any more. As a result, the present embodiment 14 offers an advantage of being able to facilitate the test of the RAM 91.

Moreover, the present embodiment 14 can decide as to whether the test result data output from the output terminals DO0, DO1 and DO2 of the RAM 91 are "111" or "000" by only checking the monitoring signal MONI without shifting the data out of the SO terminal. Accordingly, it offers an advantage of being able to facilitate the test of the RAM 91.

Furthermore, the present embodiment 14 offers an advantage of enabling the normal operation mode to utilize the flip-flops 30, 31 and 32 as the output register of the RAM 91 in the normal operation mode without increasing the circuit scale.

Embodiment 15

Figure 15:
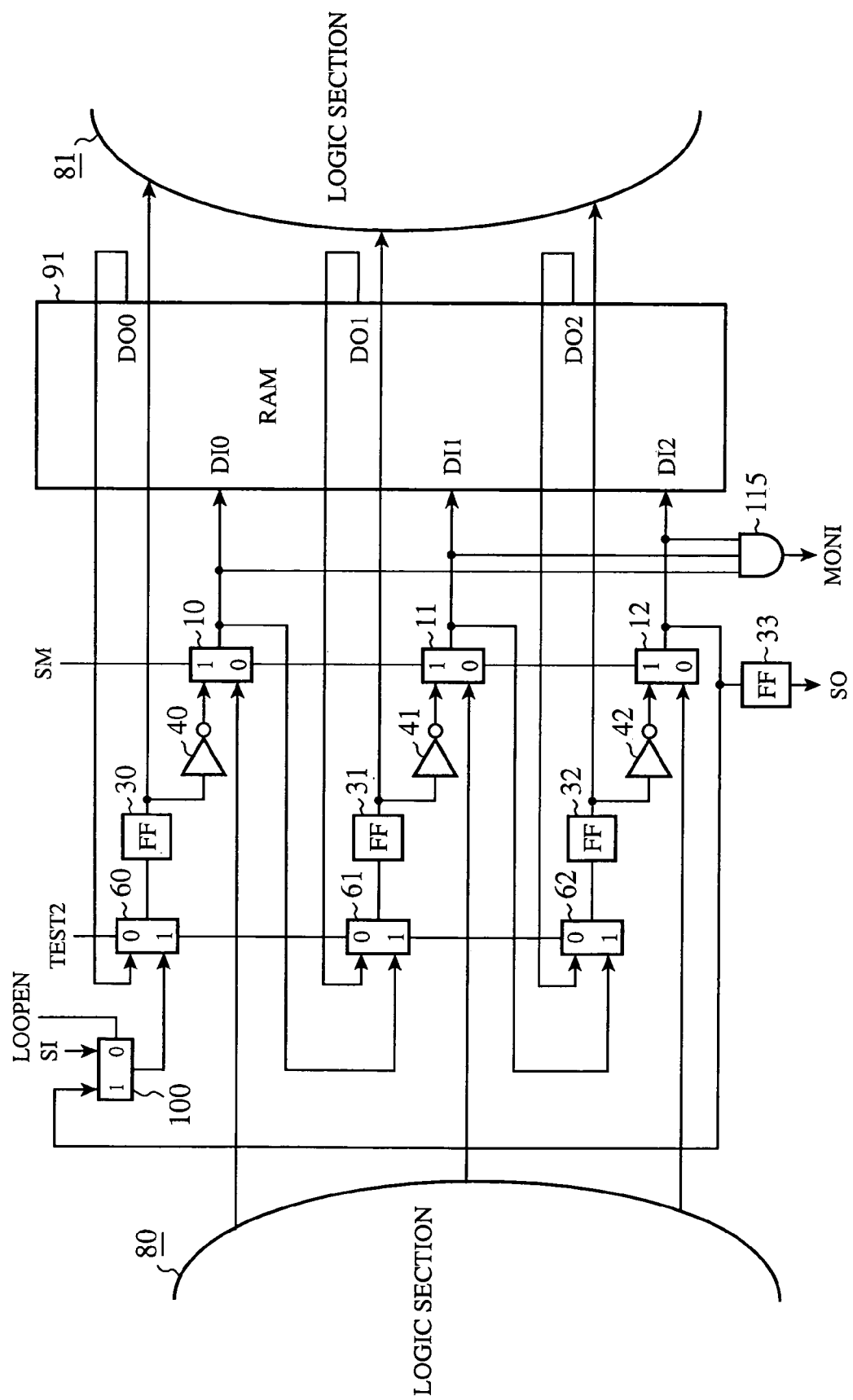
FIG. 15 is a circuit diagram showing a configuration of an embodiment 15 of the semiconductor integrated circuit in accordance with the present invention.

FIG. 15 is a circuit diagram showing a configuration of an embodiment 15 of the semiconductor integrated circuit in accordance with the present invention. In the present embodiment 15 as shown in FIG. 15, the gate circuit 110 of the embodiment 13 shown in FIG. 13 is moved from the output side of the selectors 60, 61 and 62 to the output side of the selectors 10, 11 and 12 as a gate circuit 115. The gate circuit 115 is provided to detect as to whether the values of the outputs of the selectors 10, 11 and 12 are equal. Thus, the test of the RAM 91 should be carried out considering this. In FIG. 15, although an AND gate is used as the gate circuit 115, any one of the NAND gate, OR gate and NOR gate can replace it. In addition, the flip-flops 30, 31 and 32 can be utilized as the output register of the RAM 91 in the normal operation mode in FIG. 15 as in FIG. 13.

Next, the operation of the present embodiment 15 will be described.

The operations in the normal operation mode and in the scan test mode of the logic sections 80 and 81 are the same as those of the embodiment 13. In addition, the operation of the write test of the initial data to the RAM 91 in the test of the RAM 91 is the same as that of the embodiment 13.

Next, a read and write test from and to specified addresses of the RAM 91 will be described. The selector 100 is switched to its "1" input terminal by placing the loop enabling signal at LOOPEN=1, the selectors 10, 11 and 12 are switched to their "1" input terminals by placing the shift mode signal at SM=1, and the selectors 60, 61 and 62 are switched to their "0" input terminals by placing the test mode signal at TEST2=0.

The read test from the specified addresses of the RAM 91 causes the test result data to be output from the output terminals DO0, DO1 and DO2 of the RAM 91, and transferred to the inputs of the flip-flops 30, 31 and 32 via the selectors 60, 61 and 62. Receiving one clock pulse, the flip-flops 30, 31 and 32 store the test result data. The test result data stored in the flip-flops 30, 31 and 32 are inverted by the inverters 40, 41 and 42, and transferred to the input of the gate circuit 115 via the selectors 10, 11 and 12.

In this case, if the test result data are "000", the monitoring signal MONI output from the gate circuit 115 becomes "1", and otherwise it becomes "0". Accordingly, checking the monitoring signal MONI makes it possible to decide as to whether the test result data from the output terminals DO0, DO1 and DO2 of the RAM 91 are "000" or not without shifting out the data from the SO terminal.

Then, the selectors 60, 61 and 62 are switched to their "1" input terminals by placing the test mode signal at TEST2=1. In this state, writing the inverted test result data into the RAM 91 and supplying one clock pulse to the flip-flops 30, 31 and 32 cause the data stored in the flip-flops 30, 31 and 32 to be inverted by the inverters 42, 40 and 41, selected by the selectors 12, 10 and 11, passed through the "1" input terminals of the selectors 60, 61 and 62, and captured by the flip-flops 30, 31 and 32 to be output. In this case, the data stored in the flip-flop 32 passes through the "1" input terminal of the selector 100.

The output data of the flip-flops 30, 31 and 32 are inverted by the inverters 40, 41 and 42 and transferred to the input of the gate circuit 115 via the selectors 10, 11 and 12. Accordingly, if the outputs of the flip-flops 30, 31 and 32 are "000" (that is, if the test result data are "111"), the monitor signal MONI output from the gate circuit 115 becomes "1", and unless the test result data of the RAM 91 is "111", the monitor signal MONI becomes "0". There fore checking the monitoring signal MONI makes it possible to make a decision as to whether the test result data output from the output terminals DO0, DO1 and DO2 of the RAM 91 are "111" or not without shifting out the data from the SO terminal. The read and write test of the RAM 91 is repeated a plurality of times with changing the addresses.

As described above, the present embodiment 15 can test the RAM 91 in isolation without increasing the scale of the test circuit. In addition, it can switch the test data to be written into the RAM 91 between all zero ("000") and all one ("111") at one clock cycle. As a result, it offers an advantage of being able to test the RAM 91 efficiently.

Moreover, the present embodiment 15 is configured such that the data supplied to the input terminals DI0–DI2 of the RAM 91 alternate between "111" and "000" every time the clock pulse is supplied to the flip-flops 30, 31 and 32. This is implemented by shifting the test data from the SI terminal to the flip-flops 30, 31 and 32 such that the data become "111" or "000" by placing the loop enabling signal at LOOPEN=0, and then by switching the loop enabling signal to LOOPEN=1. Thus, it becomes unnecessary to supply new test data from the SI terminal any more. As a result, the present embodiment 15 offers an advantage of being able to facilitate the test of the RAM 91.

Moreover, the present embodiment 15 can decide as to whether the test result data output from the output terminals DO0, DO1 and DO2 of the RAM 91 are "111" or "000" by only checking the monitoring signal MONI without shifting the data out of the SO terminal. Accordingly, it offers an advantage of being able to facilitate the test of the RAM 91.

Furthermore, the present embodiment 15 offers an advantage of enabling the normal operation mode to utilize the flip-flops 30, 31 and 32 as the output register of the RAM 91 in the normal operation mode without increasing the circuit scale.

Embodiment 16

Figure 16:
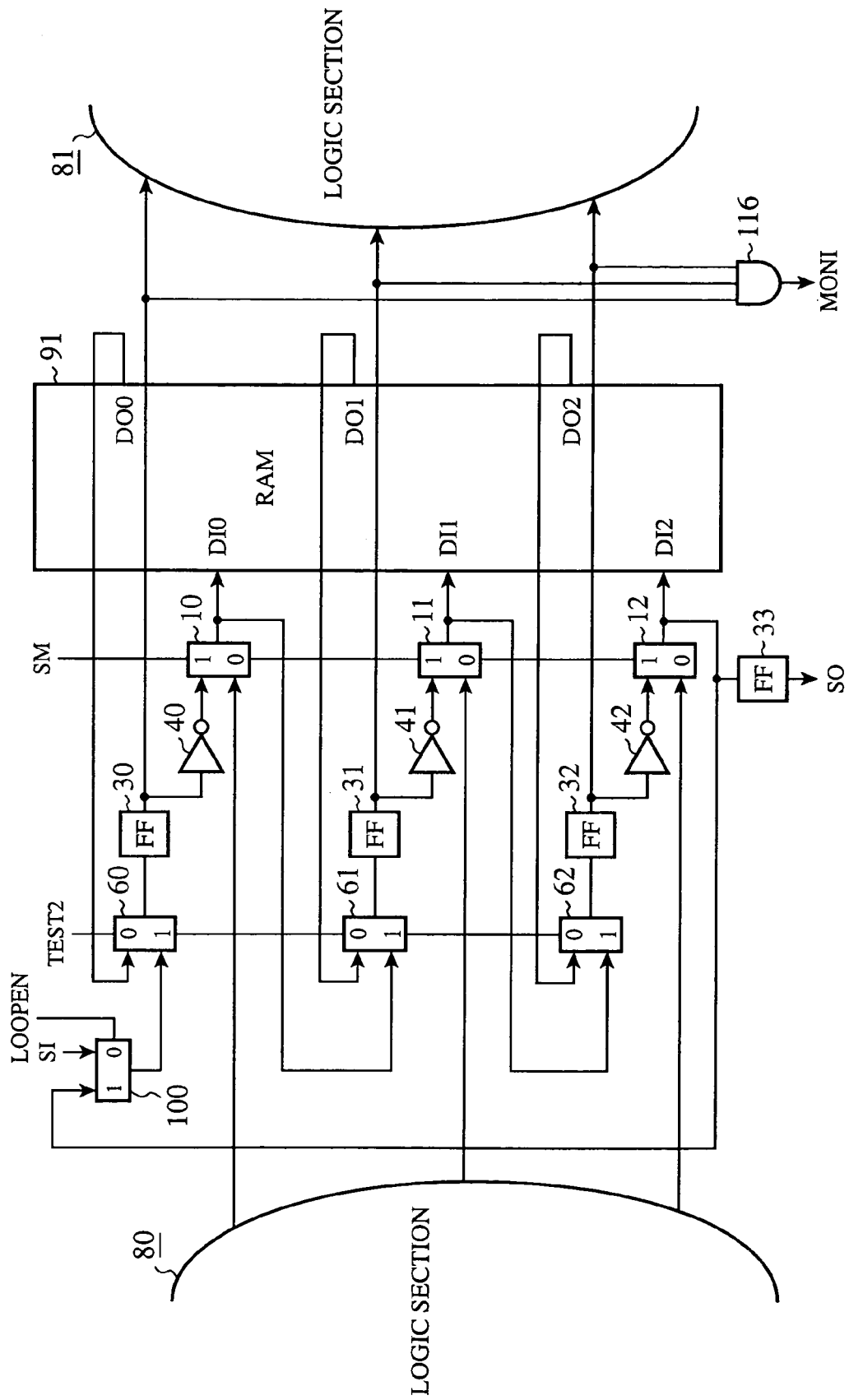
FIG. 16 is a circuit diagram showing a configuration of an embodiment 16 of the semiconductor integrated circuit in accordance with the present invention.

FIG. 16 is a circuit diagram showing a configuration of an embodiment 16 of the semiconductor integrated circuit in accordance with the present invention. In the present embodiment 16 as shown in FIG. 16, the gate circuit 110 of the embodiment 13 shown in FIG. 13 is moved from the output side of the selectors 60, 61 and 62 to the output side of the flip-flops 30, 31 and 32 as a gate circuit 116. The gate circuit 116 is provided to detect as to whether the values of the outputs of the flip-flops 30, 31 and 32 are equal. Thus, the test of the RAM 91 should be carried out considering this. In FIG. 16, although an AND gate is used as the gate circuit 116, any one of the NAND gate, OR gate and NOR gate can replace it. In addition, the flip-flops 30, 31 and 32 can be utilized as the output register of the RAM 91 in the normal operation mode in FIG. 16 as in FIG. 13.

Next, the operation of the present embodiment 16 will be described.

The operations in the normal operation mode and in the scan test mode of the logic sections 80 and 81 are the same as those of the embodiment 13. In addition, the operation of the write test of the initial data to the RAM 91 in the test of the RAM 91 is the same as that of the embodiment 13.

Next, a read and write test from and to specified addresses of the RAM 91 will be described. The selector 100 is switched to its "1" input terminal by placing the loop enabling signal at LOOPEN=1, the selectors 10, 11 and 12 are switched to their "1" input terminals by placing the shift mode signal at SM=1, and the selectors 60, 61 and 62 are switched to their "0" input terminals by placing the test mode signal at TEST2=0.

The read test from the specified addresses of the RAM 91 causes the test result data to be output from the output terminals DO0, DO1 and DO2 of the RAM 91, and transferred to the inputs of the flip-flops 30, 31 and 32 via the selectors 60, 61 and 62. Receiving one clock pulse, the flip-flops 30, 31 and 32 store the test result data. The test result data stored in the flip-flops 30, 31 and 32 are transferred to the input of the gate circuit 116.

In this case, if the test result data are "111", the monitoring signal MONI output from the gate circuit 116 becomes "1", and otherwise it becomes "0". Accordingly, checking the monitoring signal MONI makes it possible to decide as to whether the test result data from the output terminals DO0, DO1 and DO2 of the RAM 91 are "111" or not without shifting out the data from the SO terminal.

Then, the selectors 60, 61 and 62 are switched to their "1" input terminals by placing the test mode signal at TEST2=1. In this state, writing the inverted test result data into the RAM 91 and supplying one clock pulse to the flip-flops 30, 31 and 32 cause the data stored in the flip-flops 30, 31 and 32 to be inverted by the inverters 42, 40 and 41, selected by the selectors 12, 10 and 11, passed through the "1" input terminals of the selectors 60, 61 and 62, and captured by the flip-flops 30, 31 and 32 to be output. In this case, the data stored in the flip-flop 32 passes through the "1" input terminal of the selector 100.

The output data of the flip-flops 30, 31 and 32 are transferred to the input of the gate circuit 116. Accordingly, if the outputs of the flip-flops 30, 31 and 32 are "111" (that is, if the test result data are "000"), the monitor signal MONI output from the gate circuit 116 becomes "1", and unless the test result data of the RAM 91 is "000", the monitor signal MONI becomes "0". Therefore checking the monitoring signal MONI makes it possible to make a decision as to whether the test result data output from the output terminals DO0, DO1 and DO2 of the RAM 91 are "000" or not without shifting out the data from the SO terminal. The read and write test of the RAM 91 is repeated a plurality of times with changing the addresses.

As described above, the present embodiment 16 can test the RAM 91 in isolation without increasing the scale of the test circuit. In addition, it can switch the test data to be written into the RAM 91 between all zero ("000") and all one ("111") at one clock cycle. As a result, it offers an advantage of being able to test the RAM 91 efficiently.

Moreover, the present embodiment 16 is configured such that the data supplied to the input terminals DI0–DI2 of the RAM 91 alternate between "111" and "000" every time the clock pulse is supplied to the flip-flops 30, 31 and 32. This is implemented by shifting the test data from the SI terminal to the flip-flops 30, 31 and 32 such that the data become "111" or "000" by placing the loop enabling signal at LOOPEN=0, and then by switching the loop enabling signal to LOOPEN=1. Thus, it becomes unnecessary to supply new test data from the SI terminal any more. As a result, the present embodiment 16 offers an advantage of being able to facilitate the test of the RAM 91.

Moreover, the present embodiment 16 can decide as to whether the test result data output from the output terminals DO0, DO1 and DO2 of the RAM 91 are "111" or "000" by only checking the monitoring signal MONI without shifting the data out of the SO terminal. Accordingly, it offers an advantage of being able to facilitate the test of the RAM 91.

Furthermore, the present embodiment 16 offers an advantage of enabling the normal operation mode to utilize the flip-flops 30, 31 and 32 as the output register of the RAM 91 in the normal operation mode without increasing the circuit scale.

Embodiment 17

Figure 17:
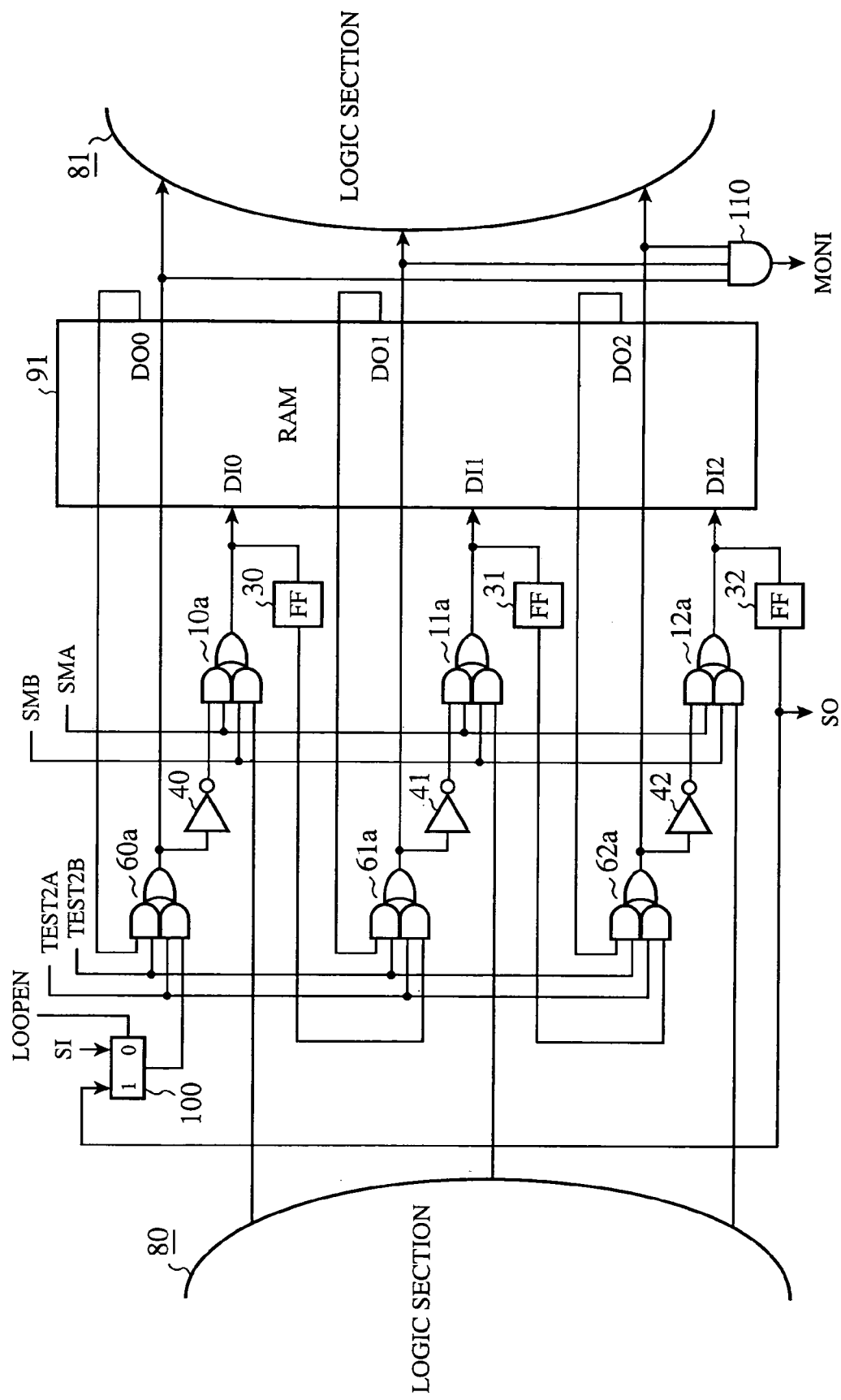
FIG. 17 is a circuit diagram showing a configuration of an embodiment 17 of the semiconductor integrated circuit in accordance with the present invention.

FIG. 17 is a circuit diagram showing a configuration of an embodiment 17 of the semiconductor integrated circuit in accordance with the present invention. In the present embodiment 17 as shown in FIG. 17, the selectors 10, 11 and 12 and the selectors 60, 61 and 62 in the embodiment 8 as shown in FIG. 8 are replaced by AND-OR compound gate type selectors 10a, 11a and 12a and AND-OR compound gate type selectors 60a, 61a and 62a. The AND-OR compound gate type selectors 10a, 11a and 12a are controlled by shift mode signals SMA and SMB, and the compound gate type selectors 60a, 61a and 62a are controlled by test mode signals TEST2A and TEST2B.

Next, the operation of the present embodiment 17 will be described.

The operation in the normal operation mode is basically equal to that of the embodiment 8. In FIG. 17, however, placing the shift mode signals at SMA=0 and SMB=1 causes the AND-OR compound gate type selectors 10a, 11a and 12a to select the output of the logic section 80, and placing the test mode signals at TEST2A=0 and TEST2B=1 causes the compound gate type selectors 60a, 61a and 62a to select the output of the RAM 91. Thus, the RAM 91 is brought into a state where it is interposed between the logic section 80 and logic section 81. In the normal operation mode, it is not necessary to supply the clock signal to the flip-flops 30, 31 and 32.

The operation in the scan test mode of the logic sections 80 and 81 is basically the same as that of the embodiment 8. In FIG. 17, however, the selector 100 is switched to its "0" input terminal by placing the loop enabling signal at LOOPEN=0, and the compound gate type selectors 60a, 61a and 62a select the scan path by placing the test mode signals at TEST2A=1 and TEST2B=0. Thus, the RAM 91 is bypassed, and the scan path is brought into a state where it is interposed between the logic section 80 and logic section 81. In this state, the scan test of the logic sections 80 and 81 is carried out by controlling the shift mode signals SMA and SMB.

To carry out the scan test of the logic section 81, the shift mode signals are placed at SMA=1 and SMB=0. Then, supplying two clock pulses to the flip-flops 30, 31 and 32 causes the 2-bit test data from the SI terminal to be stored in the flip-flops 30 and 31 by the serial shift operation.

Since the test mode signal is placed at TEST2A=1, the next 1-bit test data of the SI terminal is selected by the compound gate type selectors 60a to be input to the logic section 81. At the same time, the 1-bit test data stored in the flip-flops 30 and 31 are each selected by the compound gate type selectors 61a and 62a to be input to the logic section 81. Thus, the scan test of the logic section 81 is carried out by the total of 3-bit test data.

To carry out the scan test of the logic section 81, the shift mode signals are placed at SMA=0 and SMB=1. Then, supplying one clock pulse to the flip-flops 30, 31 and 32 causes the 3-bit test result data from the logic section 80 that receives the test data to be stored in the flip-flops 30, 31 and 32. In this case, the 1-bit data stored in the flip-flop 32 is supplied to the SO terminal.

Subsequently, placing the shift mode signals at SMA=1 and SMB=0 and supplying two clock pulses to the flip-flops 30, 31 and 32 cause the 1-bit data each stored in the flip-flops 30 and 31 to be shifted out to the SO terminal. Thus, the content of the total of 3-bit data can be confirmed. In this case, the next test data to the logic section 81 can be stored in the flip-flops 30 and 31 from the SI terminal. The scan test of the logic section 80 and logic section 81 is repeated a plurality of time with changing the input test data.

In the test of the RAM 91, it is easy to control the write data to the RAM 91 by utilizing the state in which the shift mode signals SMA=0 and SMB=0, and the state in which the test mode signals TEST2A=0 and TEST2B=0. More specifically, setting the shift mode signals at SMA=0 and SMB=0 can place the input data to the input terminals DI0, DI1 and DI2 of the RAM 91 at "000". In addition, setting the shift mode signal at SMA=1 and the test mode signals at TEST2A=0 and TEST2B=0 can place the input data to the input terminals DI0, DI1 and DI2 of the RAM 91 at "111". Thus, the present embodiment 17 can obviate the need for setting the write data by the serial shift operation of the scan path.

A write test operation of the initial data to the RAM 91 in the test of the RAM 91 will be described. The write operation of the initial data "000" is carried out by placing the initial data "000" at the input terminals DI0, DI1 and DI2 of the RAM 91 by setting the shift mode signals at SMA=0 and SMB=0. On the other hand, the write operation of the initial data "111" is carried out by placing the initial data "111" at the input terminals DI0, DI1 and DI2 of the RAM 91 by setting the shift mode signal at SMA=1 and the test mode signals at TEST2A=0 and TEST2B=0. The initial data write is repeated a plurality of times with varying the addresses.

Next, a read and write test from and to specified addresses of the RAM 91 will be described. The loop enabling signal is placed at LOOPEN=1, the shift mode signals are placed at SMA=1 and SMB=0, the test mode signals are placed at TEST2A=0 and TEST2B=1.

The read test from the specified addresses of the RAM 91 causes the test result data to be output from the output terminals DO0, DO1 and DO2 of the RAM 91, and transferred to the input of the gate circuit 110 via the compound gate type selectors 60a, 61a and 62a. If the test result data are "111", the monitor signal MONI output from the gate circuit 110 becomes "1", and if the test result data is not "111", the monitor signal MONI becomes "0". Accordingly, checking the monitor signal MONI makes it possible to decide as to whether the test result data from the output terminals DO0, DO1 and DO2 of the RAM 91 are "111" or not without shifting from the SO terminal.

The test result data from the output terminals DO0, DO1 and DO2 of the RAM 91 are inverted by the inverters 40, 41 and 42, and supplied to the input terminals DI0, DI1 and DI2 of the RAM 91 via the AND-OR compound gate type selectors 10a, 11a and 12a. Subsequently, writing the inverted test result data to the RAM 91 and supplying the flip-flops 30, 31 and 32 with one clock pulse causes the flip-flops 30, 31 and 32 to store the inverted test result data. Then, by placing the test mode signals at TEST2A=1 and TEST2B=0, the inverted test result data stored in the flip-flops 30, 31 and 32 are transferred to the input of the gate circuit 110 via the compound gate type selectors 60a, 61a and 62a. In this case, the data stored in the flip-flop 32 passes through the "1" input terminal of the selector 100.

If the test result data are "000", the input to the gate circuit 110 becomes "111", and the monitoring signal MONI output from the gate circuit 110 becomes "1". Otherwise the monitor signal MONI becomes "0". Accordingly, checking the monitoring signal MONI makes it possible to decide as to whether the test result data from the output terminals DO0, DO1 and DO2 of the RAM 91 are "000" or not without shifting out the data from the SO terminal. The read and write test of the RAM 91 is repeated a plurality of times with changing the addresses.

As described above, the present embodiment 17 can test the RAM 91 in isolation without increasing the scale of the test circuit. In addition, utilizing the state in which the shift mode signals SMA=0 and SMB=0 and the state in which the test mode signals TEST2A=0 and TEST2B=0 in the test of the RAM 91 makes it possible to obviate the need for setting the write data by the serial shift operation of the scan path. Thus, the present embodiment 17 offers an advantage of being able to facilitate the control of the write data to the RAM 91, and to eliminate the need for supplying the clock signal to the flip-flops 30, 31 and 32 in the normal operation mode.

Moreover, the present embodiment 17 can decide as to whether the test result data output from the output terminals DO0, DO1 and DO2 of the RAM 91 are "111" or "000" by only checking the monitoring signal MONI without shifting the data out of the SO terminal. Accordingly, it offers an advantage of being able to facilitate the test of the RAM 91.

Embodiment 18

Figure 18:
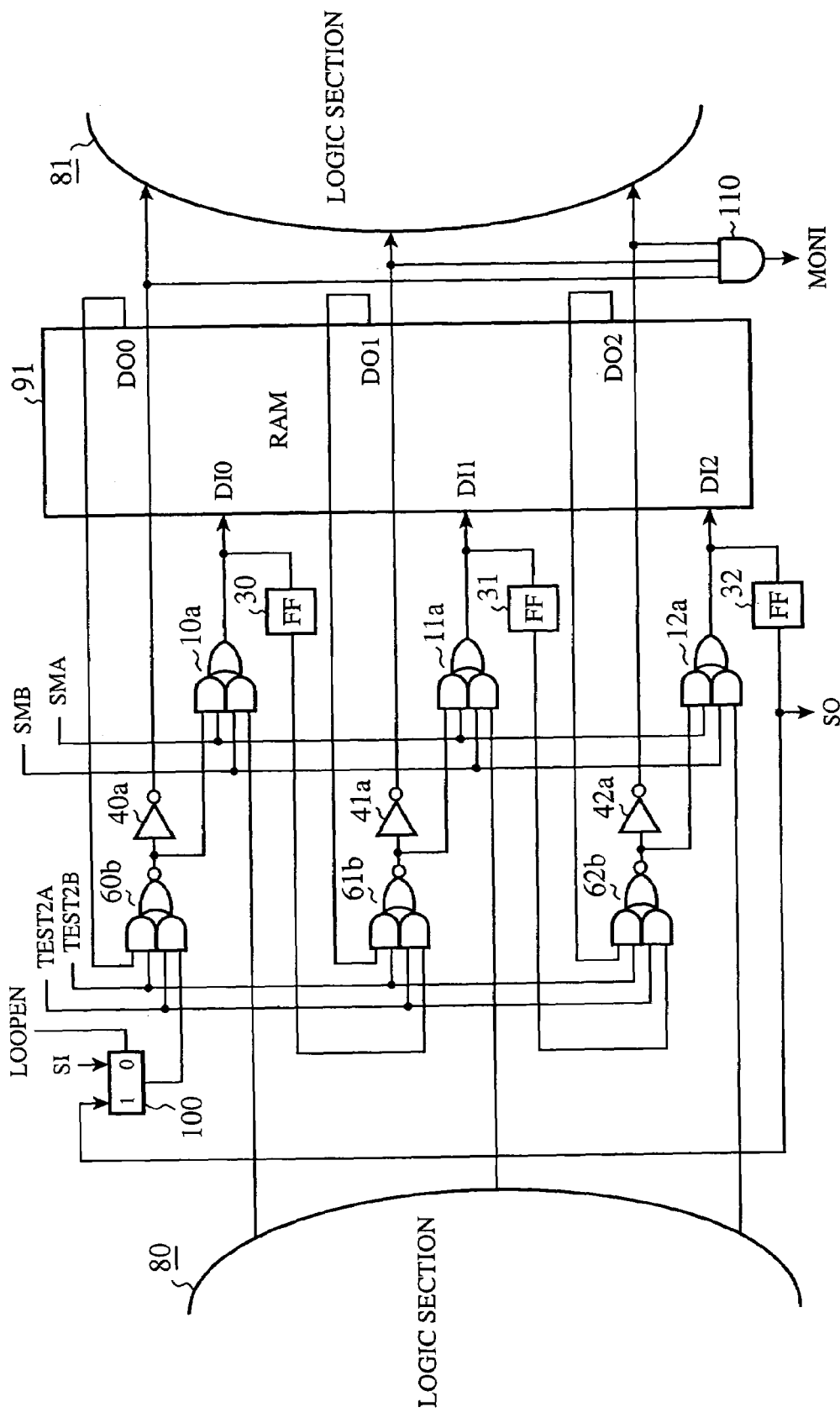
FIG. 18 is a circuit diagram showing a configuration of an embodiment 18 of the semiconductor integrated circuit in accordance with the present invention.

FIG. 18 is a circuit diagram showing a configuration of an embodiment 18 of the semiconductor integrated circuit in accordance with the present invention. In the present embodiment 18 as shown in FIG. 18, the AND-OR compound gate type selectors 60a, 61a and 62a of the embodiment 17 of FIG. 17 are replaced by AND-NOR compound gate type selectors 60b, 61b and 62b. In addition, the inverters 40, 41 and 42 interposed in the scan path in FIG. 17 are removed, and inverters 40a, 41a and 42a are added to the paths from the outputs of the AND-NOR compound gate type selectors 60b, 61b and 62c to the logic section 81.

Next, the operation of the present embodiment 18 will be described.

Since the AND-NOR compound gate type selectors 60b, 61b and 62b have the function of an inverter, the inverters 40, 41 and 42 interposed into the scan path in FIG. 17 become unnecessary. In addition, to prevent the inversion of the test result data fed from the output terminals DO0, DO1 and DO2 of the RAM 91 to the logic section 81, the outputs of the AND-NOR compound gate type selectors 60b, 61b and 62b are transferred to logic section 81 via the inverters 40a, 41a and 42a. If the inversion of the test result data from the output terminals DO0, DO0 and DO2 of the RAM 91 to the logic section 81 is allowed, the inverters 40a, 41a and 42a can be removed. The remaining operation is the same as that of the embodiment 17.

As described above, the present embodiment 18 offers the same advantages as the embodiment 17.

Embodiment 19

Figure 19:
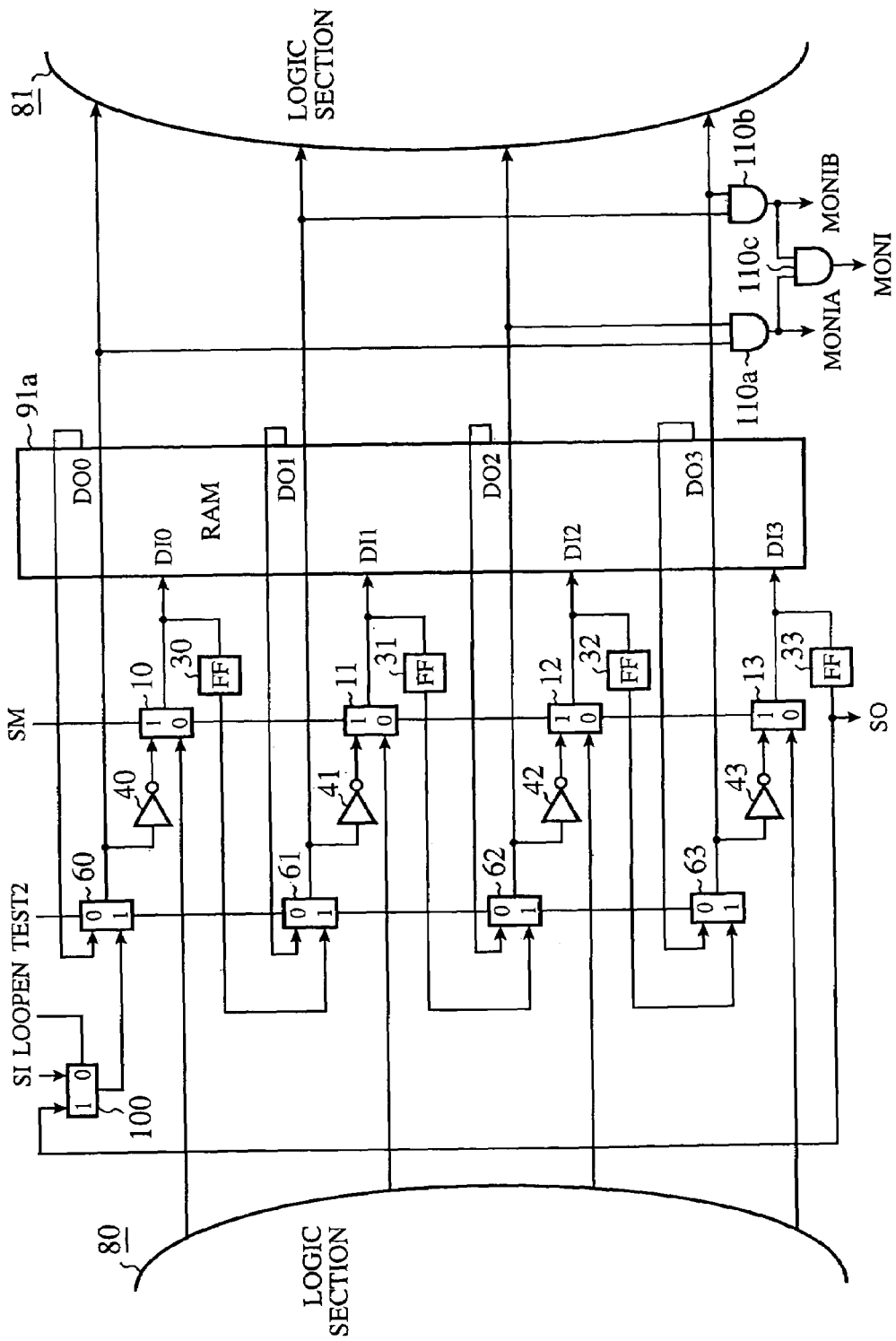
FIG. 19 is a circuit diagram showing a configuration of an embodiment 19 of the semiconductor integrated circuit in accordance with the present invention.

FIG. 19 is a circuit diagram showing a configuration of an embodiment 19 of the semiconductor integrated circuit in accordance with the present invention. Although the embodiment 8 shown in FIG. 8 is targeted at the 3-bit RAM 91, the present embodiment 19 is targeted at a 4-bit RAM 91a as shown in FIG. 19. Specifically, the RAM 91a has input terminals DI0, DI1, DI2 and DI3 and output terminals DO0, DO1, DO2 and DO3. Furthermore, a selector 13, a selector 63, a flip-flop 33 and an inverter 43 are added; the output terminals of the logic section 80 and the input terminals of the logic section 80 are made four bits each; and the gate circuit 110 in the embodiment 8 of FIG. 8 is composed of three gate circuits 110a, 110b and 110c. The input of the gate circuit 110a is connected to the outputs of the selectors 60 and 62, the input of the gate circuit 110b is connected to the outputs of the selectors 61 and 63, and the input of the gate circuit 110c is connected to the outputs of the gate circuits 110a and 110b. The output of the gate circuit 110c corresponds to the output of the gate circuit 110 in FIG. 8.

Next, the operation of the present embodiment 19 will be described.

In the test mode of the RAM 91a, for example, it is possible to test a failure as to the even-numbered bit outputs DO0 and DO2 of the RAM 91a by monitoring the output MONIA of the gate circuit 110a in the state in which the test mode signal TEST2=0. Likewise, monitoring the output MONIB of the gate circuit 110b enables the test as to a failure of the odd-numbered bit outputs DO1 and DO3 of the RAM 91a. In other words, the present embodiment 19 has an additional function to make a decision as to whether the fault position is an even bit or odd bit. Accordingly, it can carry out fault diagnosis of the RAM 91a in more detail than the embodiment 8. The remaining operation is the same as that of the embodiment 8.

As described above, the present embodiment 19 offers an advantage of being able to carry out the fault diagnosis of the RAM 91a in more detail in addition to the advantages of the embodiment 8.

Embodiment 20

Figure 20:
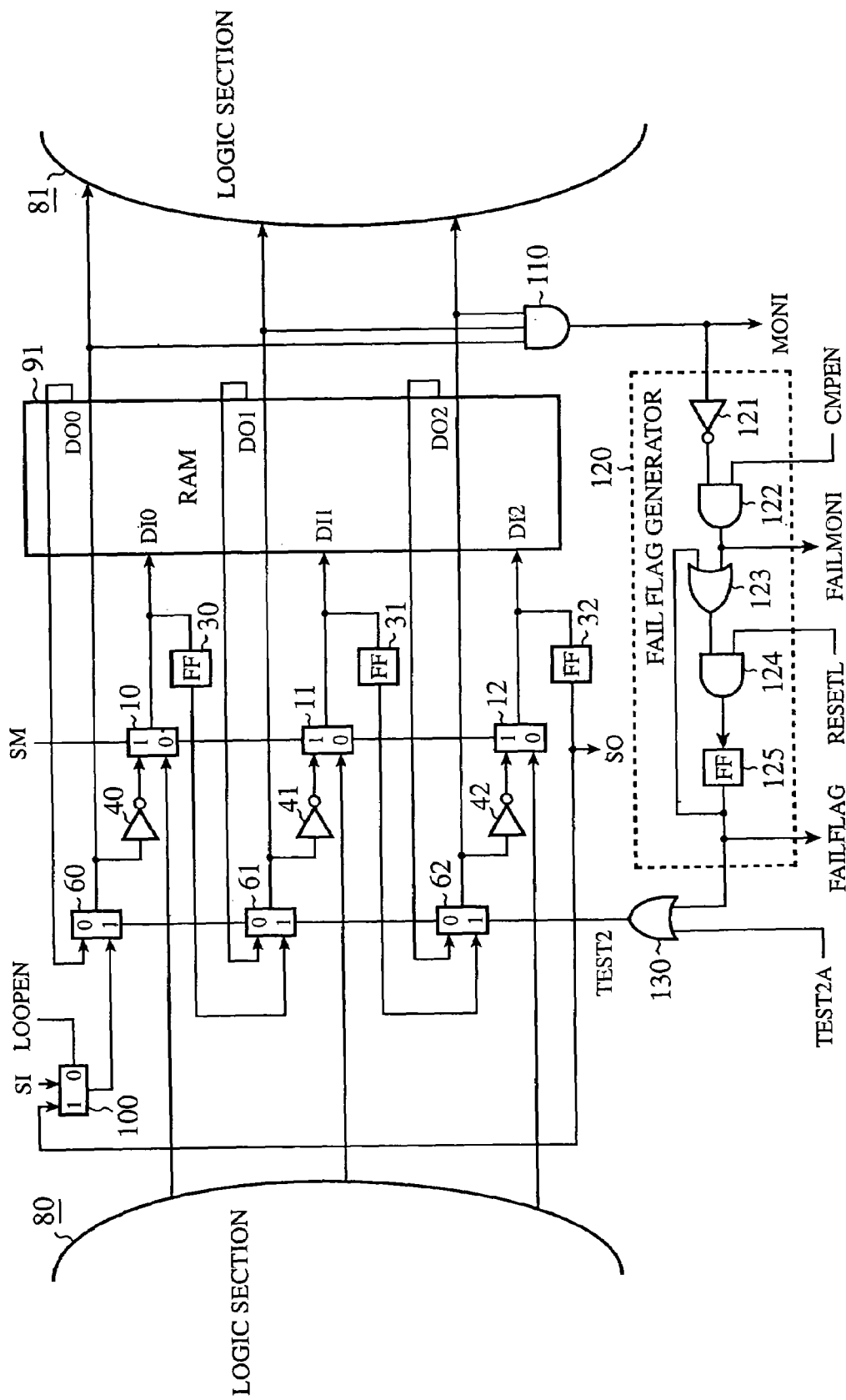
FIG. 20 is a circuit diagram showing a configuration of an embodiment 20 of the semiconductor integrated circuit in accordance with the present invention.

FIG. 20 is a circuit diagram showing a configuration of an embodiment 20 of the semiconductor integrated circuit in accordance with the present invention. As shown in FIG. 20, the present embodiment 20 includes a fail flag generator 120 and an OR circuit 130 in addition to the embodiment 8 of FIG. 8 in order to facilitate the fault diagnosis of the RAM 91. The fail flag generator 120 is composed of an inverter 121, an AND circuit 122, an OR circuit 123, an AND circuit 124, and a flip-flop 125.

In the fail flag generator 120 as shown in FIG. 20, a compare enabling signal CMPEN is placed at CMPEN=1 basically when the monitor signal is expected to become MONI=1 at the RAM test. When the monitor signal MONI is uncertain, or expected to become MONI=0, the compare enabling signal is placed at CMPEN=0 so that the compare operation of the monitor signal MONI is masked. A fail monitor signal FAILMONI is supplied to a self-test control circuit installed in an LSI, for example, to make a real-time decision as to whether a failure is present or not. Thus, if a failure is present contrary to the expectation in the state in which the compare enabling signal is set at CMPEN=1, the monitor signal becomes MONI=0, there by outputting the fail monitor signal FAILMONI=1.

The flip-flop 125 is reset to "0" by placing the reset signal at RESETL=0 and by supplying a clock signal to the flip-flop 125. The fail flag signal FAILFLAG is supplied to the self-test control circuit installed in the LSI, for example, to decide the test result of the RAM. When no failure is present, the fail monitor signal becomes FAILMONI=0, but if a failure is present, the fail monitor signal becomes FAILMONI=1. Once the fail flag signal has become FAIL-FLAG=1, the state is maintained by the OR circuit 123 in the fail flag generator 120.

The OR circuit 130 outputs a test mode signal TEST2 for the selectors 60, 61 and 62 in response to an external test mode signal TEST2A or to the fail flag signal FAILFLAG.

Next, the operation of the present embodiment 20 will be described.

To make the fault diagnosis of the RAM 91, the fail flag signal is set at FAILFLAG=0 by supplying the clock signal to the flip-flop 125 in the fail flag generator 120 in the state where the reset signal is placed at RSETL=0. Subsequently, the reset signal is placed at RSETL=1, and the test of the RAM 91 is conducted in the same manner as described in the embodiment 8 of FIG. 8.

If the monitor signal from the gate circuit 110 becomes MONI=0 because of a failure, the output of the AND circuit 124 becomes "1". Accordingly, receiving the clock signal, the flip-flop 125 outputs the fail flag signal FAILFLAG=1, which places the test mode signal at TEST2=1, thereby switching the selectors 60, 61 and 62 to their "1" input terminals. At the same time, the clock signal is also supplied to the flip-flops 30, 31 and 32 to store the fault data. Then, the subsequent RAM test is canceled, followed by the fault analysis operation for diagnosing the cause of bringing about the fail flag signal FAILFLAG=1 by the self-test control circuit in the LSI, for example.

During the test of the RAM 91, the shift mode signal is placed at SM=1. Accordingly, even when the clock signal is supplied to the flip-flops 30, 31 and 32 in the state in which the loop enabling signal is placed at LOOPEN=1, the test mode signal at TEST2=1, and the shift mode signal at SM=1, the fault data is held in a circulating shift register composed of a loop of the three flip-flops 30, 31 and 32 on the serial shift path of the scan path. Consequently, shifting out the data including the fault data from the SO terminal makes it possible to analyze the fault data bit as long as the correct number of clock pulses is known.

Take an example in which the test is carried out in a sequence of zeroth, first, second, third, . . . addresses of the RAM 91. If a failure is detected at the beginning of the first address, the fail flag signal is held at FAILFLAG=1 thereafter, and the fault analysis operation is started. The circulating shift register consisting of the three flip-flops 30, 31 and 32 connected in a loop shifts out the data including the fault data from the SO terminal.

The test for detecting a second failure is started by resetting the fail flag signal FAILFLAG. As for the test of the zeroth and first addresses in this case, however, the compare enabling signal is placed at CMPEN=0 to bring the compare operation into the masked state. The control for placing the compare enabling signal at CMPEN=0 is carried out at the first fault address stored in the self-test control circuit, for example. Since the compare enabling signal is placed at CMPEN=0 during the test of the zeroth and first addresses, the fail monitor signal FAILMONI is forcedly placed at "0" regardless of the value of the monitor signal MONI, thereby entering into the masked state.

As for the test from the second address and onward, the compare enabling signal CMPEN is controlled appropriately to carry out the compare operation. For example, assume that the third address includes the second failure. In this case, the fail flag signal is placed at FAILFLAG=1 by the test of the third address, and hence the fault analysis operation is started. Thus, the circulating shift register consisting of the three flip-flops 30, 31 and 32 connected in loop shifts out the data including the fault data from the SO terminal.

When the RAM 91 consists of a RAM with a redundancy function, the fault data can be used as switching control data of the redundancy circuit.

As described above, in addition to the advantages of the embodiment 8, the present embodiment 20 offers an advantage of being able to carry out detailed diagnosis as to the failure detected by generating the fail flag signal FAILFLAG with the fail flag generator 120, by storing the fault data of the RAM 91 into the flip-flops 30, 31 and 32, and by shifting out the fault data from the SO terminal after completing the test or after halting the test.

Incidentally, the present invention need not be applied to all the input/output terminals of the functional block 90 or RAM 91, but can achieve its advantages by applying it to a part of them. For example, when the number of the input terminals of the functional block 90 differs from that of its output terminals, the present invention can be implemented by making pairs, with matching their number to the smaller number between the input and output terminals.

What is claimed is:

1. A semiconductor integrated circuit comprising:
   a first logic section and a second logic section;
   a functional block connected between said first logic section and said second logic section;
   a scan path that includes, between an output of said first logic section and an input of said functional block, a parallel path and a serial shift path for serially transferring data, and that includes a plurality of first selectors for switching and connecting one of the output of said first logic section and said serial shift path to the input of said functional block, and a plurality of flip-flops for storing the data; and a plurality of second selectors connected into said serial shift path of said scan path, for switching and connecting one of an output of said functional block and said serial shift path to an input of said second logic section, wherein test data is provided from said serial shift path of said scan path to said functional block via said second selectors, and data output from said functional block is output via said second selectors after switching said second selectors.

2. The semiconductor integrated circuit according to claim 1, wherein said flip-flops on said serial shift path are connected the outside of the parallel path between the output of said first logic section and the input of said functional block.

3. The semiconductor integrated circuit according to claim 1, wherein said functional block consists of a RAM (Random Access Memory), and said scan path includes a plurality of inverters interposed into said serial shift path to change the data to be provided to said RAM by alternating to all zeroes or all ones each shift operation clock cycle.

4. The semiconductor integrated circuit according to claim 3, wherein said inverters are connected to the output of said second selectors.

5. The semiconductor integrated circuit according to claim 3, wherein said scan path further comprises a third selector for feeding an output of said serial shift path back to an input of said serial shift path.

6. The semiconductor integrated circuit according to claim 5, further comprising a gate circuit for detecting that the data output from said functional block via said second selectors take a specified value.

7. The semiconductor integrated circuit according to claim 5, further comprising a gate circuit for detecting that the data output from said functional block via said inverters take a specified value.

8. The semiconductor integrated circuit according to claim 5, further comprising a gate circuit for detecting that the data output from said functional block via said first selectors take a specified value.

9. The semiconductor integrated circuit according to claim 5, further comprising a gate circuit for detecting that the data output from said functional block and stored in said flip-flops take a specified value.

10. The semiconductor integrated circuit according to claim 1, wherein said flip-flops on said serial shift path of said scan path have inputs of said flip-flops connected to outputs of the second selectors, and have outputs of said flip-flops connected to the input of said second logic section.

11. The semiconductor integrated circuit according to claim 10, wherein said functional block consists of a RAM, and said semiconductor integrated circuit further comprises:
a plurality of inverters interposed into said serial shift path of said scan path to change the data to be provided to said RAM by alternating to all zeroes or all ones each shift operation clock cycle;
a third selector for feeding an output of said serial shift path of said scan path back to an input of said serial shift path; and
a gate circuit for detecting that data output from said RAM via said second selectors take a specified value.

12. The semiconductor integrated circuit according to claim 10, wherein said functional block consists of a RAM, and said semiconductor integrated circuit further comprises:
a plurality of inverters interposed into said serial shift path of said scan path to change the data to be provided to said RAM by alternating to all zeroes or all ones each shift operation clock cycle;
a third selector for feeding an output of said serial shift path of said scan path back to an input of said serial shift path; and
a gate circuit for detecting that data output from said RAM via said inverters take a specified value.

13. The semiconductor integrated circuit according to claim 10, wherein said functional block consists of a RAM, and said semiconductor integrated circuit further comprises:
a plurality of inverters interposed into said serial shift path of said scan path to change the data to be provided to said RAM by alternating to all zeroes or all ones each shift operation clock cycle;
a third selector for feeding an output of said serial shift path of said scan path back to an input of said serial shift path; and
a gate circuit for detecting that data output from said RAM via said first selectors take a specified value.

14. The semiconductor integrated circuit according to claim 10, wherein said functional block consists of a RAM, and said semiconductor integrated circuit further comprises:
a plurality of inverters interposed into said serial shift path of said scan path to change the data to be provided to said RAM by alternating to all zeroes or all ones each shift operation clock cycle;
a third selector for feeding an output of said serial shift path of said scan path back to an input of said serial shift path; and
a gate circuit for detecting that data output from said RAM and stored in said flip-flops take a specified value.

15. The semiconductor integrated circuit according to claim 1, wherein said functional block consists of a RAM, and said first selectors and said second selectors consist of AND-OR compound gate type selectors.

16. The semiconductor integrated circuit according to claim 1, wherein said functional block consists of a RAM, and said first selectors and said second selectors consist of AND-OR compound gate type selectors and AND-NOR compound gate type selectors.

17. The semiconductor integrated circuit according to claim 1, wherein said functional block consists of a RAM, and said semiconductor integrated circuit further comprises:
a plurality of inverters interposed into said serial shift path of said scan path to change the data to be provided to said RAM by alternating to all zeroes or all ones each shift operation clock cycle;
a third selector for feeding an output of said serial shift path of said scan path back to an input of said serial shift path;
a gate circuit for detecting that odd-numbered bit data output from said RAM via said scan path take a specified value; and
a gate circuit for detecting that even-numbered bit data output from said RAM via said scan path take a specified value.

18. The semiconductor integrated circuit according to claim 1, wherein said functional block consists of a RAM, and said semiconductor integrated circuit further comprises:
a plurality of inverters interposed into said serial shift path of said scan path to change the data to be provided to said RAM by alternating to all zeroes or all ones each shift operation clock cycle;
a third selector for feeding an output of said serial shift path of said scan path back to an input of said serial shift path;
a gate circuit for detecting that data output from said RAM via said scan path take a specified value; and
a fail flag generator for producing a fail flag signal to cancel a next RAM test and carry out fault analysis, when said gate circuit detects that the data from said RAM differ from the specified value, and for switching said second selectors to said serial shift path.

* * * * *